(12) United States Patent
Choi

(10) Patent No.: US 11,056,204 B2
(45) Date of Patent: Jul. 6, 2021

(54) MEMORY DEVICE AND METHOD OF OPERATING THE SAME

(71) Applicant: SK hynix Inc., Gyeonggi-do (KR)

(72) Inventor: Hyung Jin Choi, Ulsan (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/870,606

(22) Filed: May 8, 2020

(65) Prior Publication Data
US 2021/0166772 A1 Jun. 3, 2021

(30) Foreign Application Priority Data
Dec. 3, 2019 (KR) .................. 10-2019-0158811

(51) Int. Cl.
*G11C 16/34* (2006.01)
*G11C 16/04* (2006.01)
*G11C 16/10* (2006.01)
*G11C 11/56* (2006.01)

(52) U.S. Cl.
CPC ...... *G11C 16/3459* (2013.01); *G11C 11/5628* (2013.01); *G11C 11/5671* (2013.01); *G11C 16/0483* (2013.01); *G11C 16/10* (2013.01); *G11C 2211/5621* (2013.01)

(58) Field of Classification Search
CPC ........... G11C 16/3459; G11C 11/5628; G11C 11/5671; G11C 16/10; G11C 16/0483; G11C 2211/5621
See application file for complete search history.

(56) References Cited

U.S. PATENT DOCUMENTS

| 9,449,694 | B2* | 9/2016 | Paudel | ............... | G11C 11/5628 |
| 10,373,689 | B2* | 8/2019 | Lee | ............... | G11C 16/16 |
| 2010/0195397 | A1* | 8/2010 | Hemink | ............... | G11C 16/0483 |
| | | | | | 365/185.17 |
| 2019/0295669 | A1* | 9/2019 | Yang | ............... | G11C 16/08 |

FOREIGN PATENT DOCUMENTS

| KR | 10-2014-0139335 | 12/2014 |
| KR | 10-1802815 | 12/2017 |
| KR | 10-1939235 | 1/2019 |

* cited by examiner

*Primary Examiner* — Gene N Auduong
(74) *Attorney, Agent, or Firm* — IP & T Group LLP

(57) ABSTRACT

The present disclosure relates to a memory device includes a memory cell array, a peripheral circuit and a program operation controller. The memory cell array including a plurality of memory cells each having a target programmed state among a plurality of programmed states. The peripheral circuit performs at least one program loop including applying a program voltage to a word line coupled in common to the plurality of memory cells, and selectively performing a verify operation of determining whether a threshold voltage of each of the plurality of memory cells exceeds a verify voltage. The program operation controller controls the peripheral circuit to perform the at least one program loop corresponding to at least one of remaining programmed states other than a most significant programmed state among the plurality of programmed states, and apply a program pulse corresponding to the most significant programmed state to the word line.

20 Claims, 16 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0158811, filed on Dec. 3, 2019, which is incorporated herein by reference in its entirety.

BACKGROUND

Field of Invention

Various embodiments of the present disclosure relate to an electronic device, and more particularly, to a memory device and a method of operating the same.

Description of Related Art

A storage device is configured to store data. A storage device may include a memory device configured to store data, and a memory controller configured to control the memory device. A memory device is embodied using a semiconductor such as silicon (Si), germanium (Ge), gallium arsenide (GaAs), indium phosphide (InP), or the like. There are two types of memory devices: a volatile memory device and a nonvolatile memory device.

In a volatile memory device data stored therein is lost when power is interrupted. Representative examples of a volatile memory device include a static RAM (SRAM), a dynamic RAM (DRAM), and a synchronous DRAM (SDRAM).

A nonvolatile memory device retains data stored therein even when power is interrupted. Representative examples of a nonvolatile memory device include a read only memory (ROM), a programmable ROM (PROM), an electrically programmable ROM (EPROM), an electrically erasable programmable ROM (EEPROM), a flash memory (which may be a NOR or a NAND type), a phase-change random access memory (PRAM), a magnetic RAM (MRAM), a resistive RAM (RRAM), and a ferroelectric RAM (FRAM).

SUMMARY

Various embodiments of the present disclosure are directed to a memory device having improved program performance, and a method of operating the memory device.

An embodiment of the present disclosure may provide for a method of operating a memory device including a plurality of memory cells each having a target programmed state among a plurality of programmed states, the method including: performing at least one program loop corresponding to at least one of the programmed states other than a most significant programmed state among the plurality of programmed states; and applying a program pulse corresponding to the most significant programmed state to a word line. The at least one program loop may include applying a program voltage to a word line coupled in common to the plurality of memory cells, and selectively performing a verify operation of determining whether a threshold voltage of each of the plurality of memory cells exceeds a verify voltage.

An embodiment of the present disclosure may provide for a memory device including: a memory cell array including a plurality of memory cells each having a target programmed state among a plurality of programmed states; a peripheral circuit configured to perform at least one program loop including applying a program voltage to a word line coupled in common to the plurality of memory cells, and selectively performing a verify operation of determining whether a threshold voltage of each of the plurality of memory cells exceeds a verify voltage; and a program operation controller configured to control the peripheral circuit to perform the at least one program loop corresponding to at least one of remaining programmed states other than a most significant programmed state among the plurality of programmed states, and apply a program pulse corresponding to the most significant programmed state to the word line.

An embodiment of the present disclosure may provide for a method of operating a memory device including a plurality of memory cells each having a target programmed state among a plurality of programmed states, the method including: performing at least one program loop corresponding to at least one of the programmed states other than a most significant programmed state among the plurality of programmed states; verifying a threshold voltage of each of the plurality of memory cells having the most significant programmed state as the target programmed state; controlling a voltage to be applied to a bit line coupled to each of memory cells having the most significant programmed state as the target programmed state based on a result of the verifying; and applying a program pulse corresponding to the most significant programmed state to a word line. The at least one program loop may include applying a program voltage to a word line coupled in common to the plurality of memory cells, and selectively performing a verify operation of determining whether a threshold voltage of each of the plurality of memory cells exceeds a verify voltage.

An embodiment of the present disclosure may provide for a method of operating a memory device including a plurality of memory cells, the method including: performing plural programming operation loops on the memory cells for first to $(N-1)^{th}$ program states, the programming operation loops being successful; and applying a target program pulse to the memory cells for an $N^{th}$ program state, without verifying whether or not the memory cells for the $N^{th}$ program state were successfully programmed by the target program pulse. A step voltage between the target program pulse and a program pulse, which is last within the program loops, is at least two times a step voltage used in the program loops.

DETAILED DESCRIPTION

Specific structural and functional description provided herein is for describing embodiments of the present disclosure. However, the present invention may be embodied in other forms and ways; thus, the present invention is not limited by or to any particular embodiment(s) or any specific details. Throughout the specification, reference to "an embodiment," "another embodiment" or the like is not necessarily to only one embodiment, and different references to any such phrase are not necessarily to the same embodiment(s).

Various embodiments of the present disclosure are described more fully below with reference to the accompanying drawings, so that those of ordinary skill in the art can practice the invention.

Figure 1:
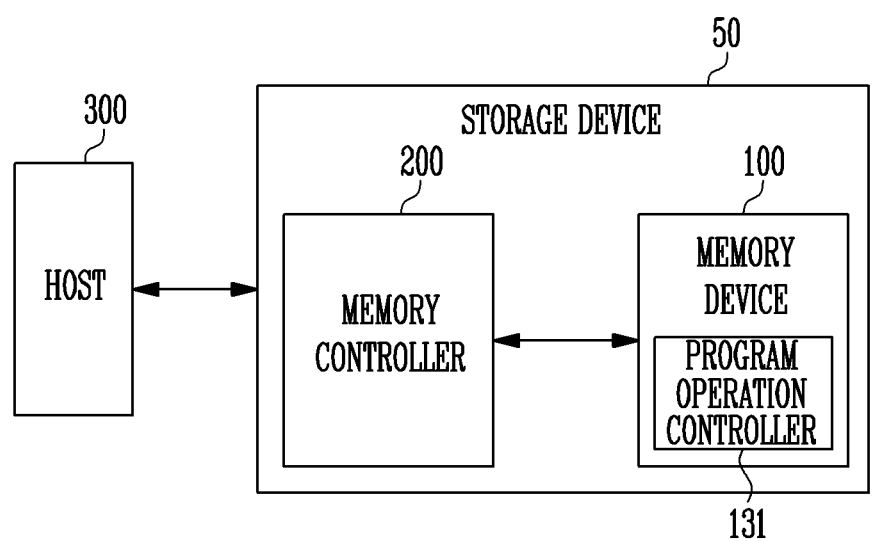
FIG. 1 is a block diagram illustrating a storage device in accordance with an embodiment of the present disclosure.

FIG. 1 is a block diagram illustrating a storage device 50 in accordance with an embodiment of the present disclosure.

Referring to FIG. 1, the storage device 50 may include a memory device 100 and a memory controller 200 configured to control the operation of the memory device 100.

The storage device 50 may be configured to store data under control of a host 300 such as a cellular phone, a smartphone, an MP3 player, a laptop computer, a desktop computer, a game machine, a TV, a tablet PC, or an in-vehicle infotainment system.

The storage device 50 may be implemented as any of various kinds of storage devices depending on a host interface, which is a communication system with the host 300. For example, the storage device 50 may be configured as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and/or a memory stick.

The storage device 50 may be manufactured in the form of any of various package types. For instance, the storage device 50 may be manufactured in the form of a package on package (POP) type, a system in package (SIP) type, a system on chip (SOC) type, a multi-chip package (MCP) type, a chip on board (COB) type, a wafer-level fabricated package (WFP) type, and/or a wafer-level stack package (WSP) type.

The memory device 100 may store data therein. The memory device 100 may operate under control of the memory controller 200. The memory device 100 may include a memory cell array including a plurality of memory cells configured to store data therein.

The memory cells may include a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. Each memory block may include a plurality of pages. In an embodiment, each page may be the unit of storing data in the memory device 100 or reading stored data from the memory device 100. Each memory block may be the unit of erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

The memory device 100 may receive a command and an address from the memory controller 200. The memory device 100 may access an area of the memory cell array that is selected by the received address. Accessing the selected area may refer to performing an operation corresponding to the received command for the selected area. For example, the memory device 100 may perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

In various embodiments, the memory device 100 may include a program operation controller 131. The memory device 100 may perform a program operation of storing data in memory cells included in the memory device 100 in response to a program command received from the memory controller 200. The program operation may include a program loop. The program loop may include a program voltage application operation of applying a program voltage, and a verify operation of verifying a program result using a verify voltage. The program operation may include increasing a threshold voltage of a memory cell. The program operation may be performed by iteration of a plurality of program loops PL. Each program loop may include a program voltage application operation of applying a program voltage, and a verify operation of verifying a program result using a verify voltage. The program operation controller 131 may control the number of the program loops PL performed (iteration count) depending on a programmed state so as to enhance the program performance. Detailed description of variation in voltage to be applied to a word line according to the memory device and the method of operating the memory device in accordance with embodiments of the present disclosure is provided with reference to the accompanying drawings.

The memory controller 200 may control the overall operation of the storage device 50.

When power is applied to the storage device 50, the memory controller 200 may execute firmware (FW). The firmware FW may include a host interface layer (HIL) configured to receive a request input from the host 300 or output a response to the host 300, a flash translation layer (FTL) configured to manage an operation between an interface of the host 300 and an interface of the memory device 100, and a flash interface layer (FIL) configured to provide a command to the memory device 100 or receive a response from the memory device 100.

In an embodiment, the memory controller 200 may receive data and a logical address (LA) from the host 300, and translate the LA into a physical address (PA) indicating addresses of memory cells to which data is to be stored, the memory cells being included in the memory device 100. The logical address may be a logical block address (LBA). The physical address may be a physical block address (PBA).

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously control the memory device 100 to perform a program operation, a read operation, or an erase operation regardless of a request from the host 300. For example, the memory controller 200 may control the memory device 100 to perform a program operation, a read operation, or an erase operation which is used to perform background operations such as a wear leveling operation, a garbage collection operation, and a read reclaim operation.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and/or load reduced DIMM (LRDIMM) communication methods.

Figure 2:
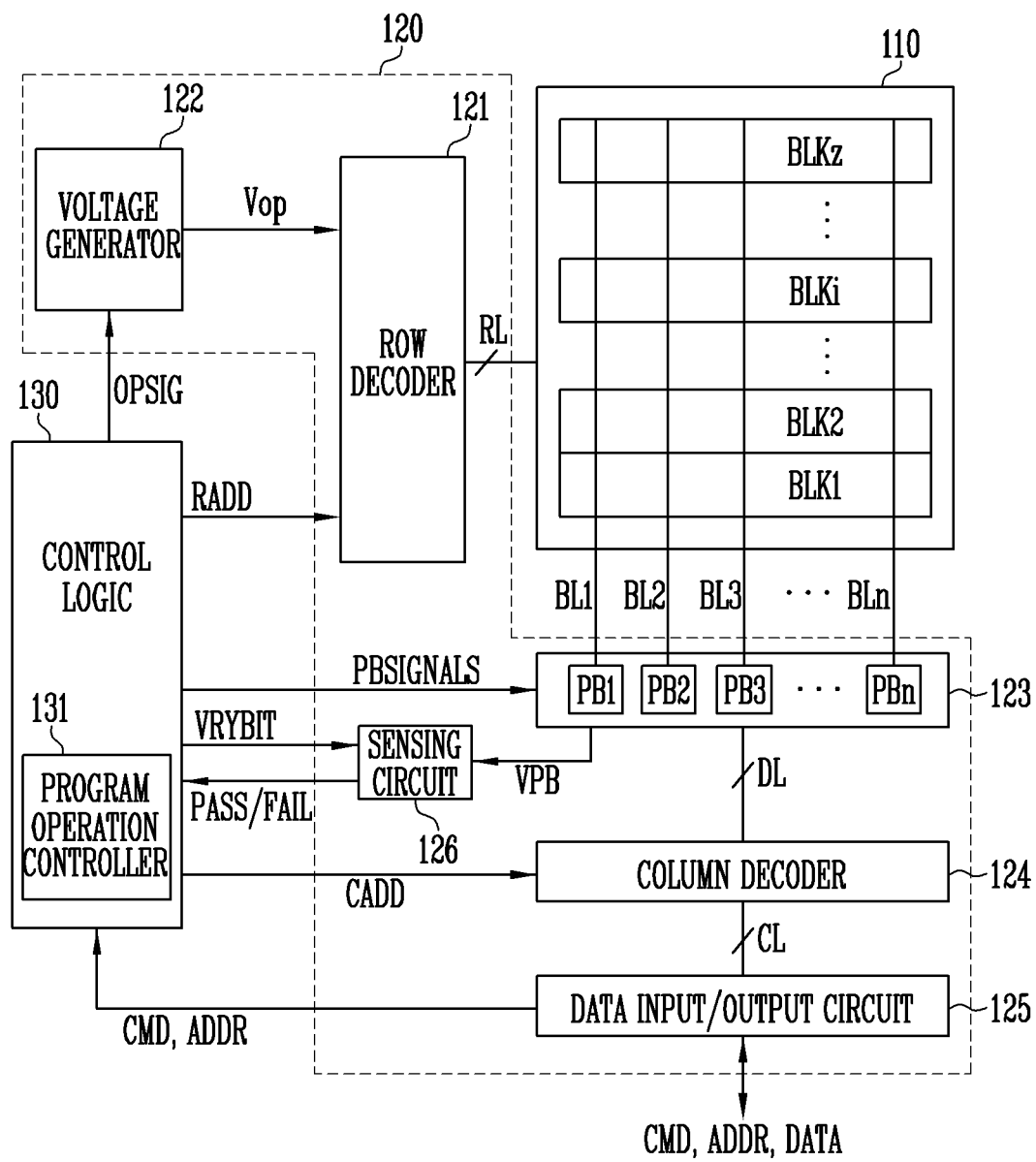
FIG. 2 is a diagram illustrating a memory device in accordance with an embodiment of the present disclosure.

FIG. 2 is a diagram illustrating a memory device 100 in accordance with an embodiment of the present disclosure.

Referring to FIG. 2, the memory device 100 may include a memory cell array 110, a peripheral circuit 120, and control logic 130.

The memory cell array 110 may include a plurality of memory blocks BLK1 to BLKz, which are coupled to an address decoder 121 through row lines RL. The plurality of memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as one page. In other words, the memory cell array 110 may be formed of a plurality of physical pages. Hence, each memory block may include a plurality of pages.

Each of the memory cells included in the memory cell array 110 may be a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under control of the control logic 130. The peripheral circuit 120 may drive the memory cell array 110. For example, the peripheral circuit 120 may apply various operating voltages to the row lines RL and the bit lines BL1 to BLn or discharge the applied voltages, under control of the control logic 130.

The peripheral circuit 120 may include the address decoder 121, a voltage generator 122, the page buffer group 123, a column decoder 124, an input/output circuit 125, and a sensing circuit 126.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The address decoder 121 may operate under control of the control logic 130. The address decoder 121 may receive row addresses ADDR from the control logic 130.

The address decoder 121 may decode the row address RADD. The address decoder 121 may select at least one of the memory blocks BLK1 to BLKz according to the decoded address. The address decoder 121 may select at least one word line WL of the selected memory block in response to the decoded address so that voltages generated from the voltage generator 122 are applied to the at least one word line WL.

For example, during a program operation, the address decoder 121 may apply a program voltage to a selected word line and apply a program pass voltage having a level lower than that of the program voltage to unselected word lines. During a program verify operation, the address decoder 121 may apply a verify voltage to a selected word line and apply a verify pass voltage higher than the verify voltage to unselected word lines. During a read operation, the address decoder 121 may apply a read voltage to a selected word line and apply a read pass voltage higher than the read voltage to unselected word lines.

In an embodiment, an erase operation of the memory device 100 may be performed on a memory block basis. During an erase operation, the address decoder 121 may select one memory block in response to a decoded address. During the erase operation, the address decoder 121 may apply a ground voltage to word lines coupled to the selected memory block.

The voltage generator 122 may operate under control of the control logic 130. The voltage generator 122 may generate a plurality of voltages using an external supply voltage supplied to the memory device 100. In detail, the voltage generator 122 may generate various operating voltages Vop to be used for a program operation, a read operation, and an erase operation in response to an operating signal OPSIG. For example, the voltage generator 122 may generate a program voltage, a verify voltage, a pass voltage, a read voltage, an erase voltage, and so forth under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using an external power supply voltage or an internal power supply voltage.

For example, the voltage generator 122 may include a plurality of pumping capacitors for receiving the internal supply voltage and generate a plurality of voltages by selectively activating the plurality of pumping capacitors under control of the control logic 130.

The generated voltages may be supplied to the memory cell array 110 by the address decoder 121.

In an embodiment, the operating signal OPSIG may further include a target pulse generating signal TAGSIG. The voltage generator 122 may generate a target voltage pulse Vtp in response to the target pulse generating signal TAGSIG. The generated target voltage pulse Vtp may be a voltage to be applied to a select word line on which a program operation is to be performed. The target voltage pulse Vtp may be a program pulse to be applied to the select word line when the program operation is performed on a memory cell having a final programmed state as a target programmed state.

The page buffer group 123 may include first to n-th page buffers PB1 to PBn. The first to n-th page buffers PB1 to PBn are coupled to the memory cell array 110 through the first to n-th bit lines BL1 to BLn, respectively. The first to n-th page buffers PB1 to PBn may operate under control of the control logic 130. In detail, the first to n-th page buffers PB1 to PBn may operate in response to page buffer control signals PBSIGNALS. For instance, the first to n-th page buffers PB1 to PBn may temporarily store data received through the first to n-th bit lines BL1 to BLn, or sense voltages or currents of the first to n-th bit lines BL1 to BLn during a read operation or a verify operation.

In detail, during a program operation, the first to n-th page buffers PB1 to PBn may transmit data DATA received through the data input/output circuit 125 to selected memory cells through the first to n-th bit lines BL1 to BLn when a program pulse is applied to a selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to n-th page buffers PB1 to PBn may read page data from selected memory cells through the first to n-th bit lines BL1 to BLn.

During a read operation, the first to n-th page buffers PB1 to PBn may read data DATA from memory cells of a selected page through the first to n-th bit lines BL1 to BLn, and output the read data DATA to the data input/output circuit 125 under control of the column decoder 124.

During an erase operation, the first to n-th page buffers PB1 to PBn may float the first to n-th bit lines BL1 to BLn.

The column decoder 124 may transmit data between the data input/output circuit 125 and the page buffer group 123 in response to a column address CADD. For example, the column decoder 124 may exchange data with the first to n-th page buffers PB1 to PBn through data lines DL or exchange data with the data input/output circuit 125 through column lines CL.

The data input/output circuit 125 may transmit, to the control logic 130, a command CMD or an address ADDR received from the memory controller 200 described with reference to FIG. 1, or may exchange data DATA with the column decoder 124.

During a read operation or a verify operation, the sensing circuit 126 may generate a reference current in response to an enable bit signal VRYBIT, and may compare a sensing voltage VPB received from the page buffer group 123 with a reference voltage generated by the reference current and output a pass signal PASS or a fail signal FAIL.

In an embodiment, the sensing circuit 126 may transmit, to the control logic 130, a pass signal PASS indicating that a verify operation on memory cells having a programmed state adjacent to a most significant programmed state as a target programmed state has succeeded. The control logic 130 may transmit a target pulse generating signal TAGSIG to the voltage generator 122 in response to the pass signal PASS received form the sensing circuit 126. For example, it is assumed that each memory cell is formed of a TLC. A pass signal PASS indicating that a verify operation for a sixth programmed state P6 has succeeded may be input from the sensing circuit 126 to the control logic 130. The program operation controller 131 may provide a target pulse generating signal TAGSIG to the voltage generator 122 to program memory cells having a seventh programmed state P7 as a target programmed state.

The control logic 130 may output an operating signal OPSIG, a row address RADD, page buffer control signals PBSIGNALS, and an enable bit signal VRYBIT in response to a command CMD and an address ADD, and thus control the peripheral circuit 120. In addition, the control logic 130 may determine whether a target memory cell has passed a verification during a verify operation in response to a pass signal PASS or a fail signal FAIL.

Figure 3:
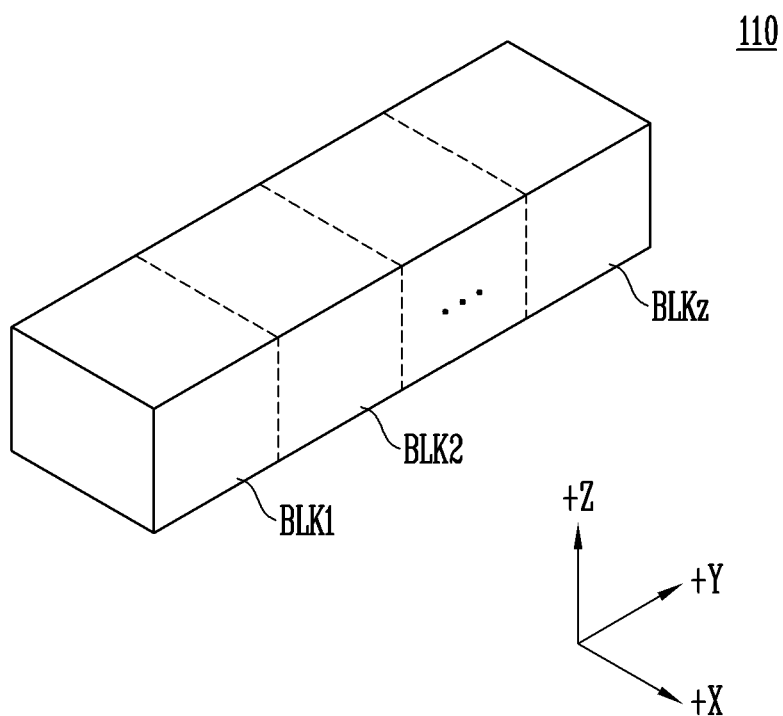
FIG. 3 is a diagram illustrating an example of a memory cell array, such as that of FIG. 2.

FIG. 3 is a diagram illustrating an example of the memory cell array of FIG. 2.

Referring to FIG. 3, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block is described in more detail with reference to FIGS. 4 and 5.

Figure 4:
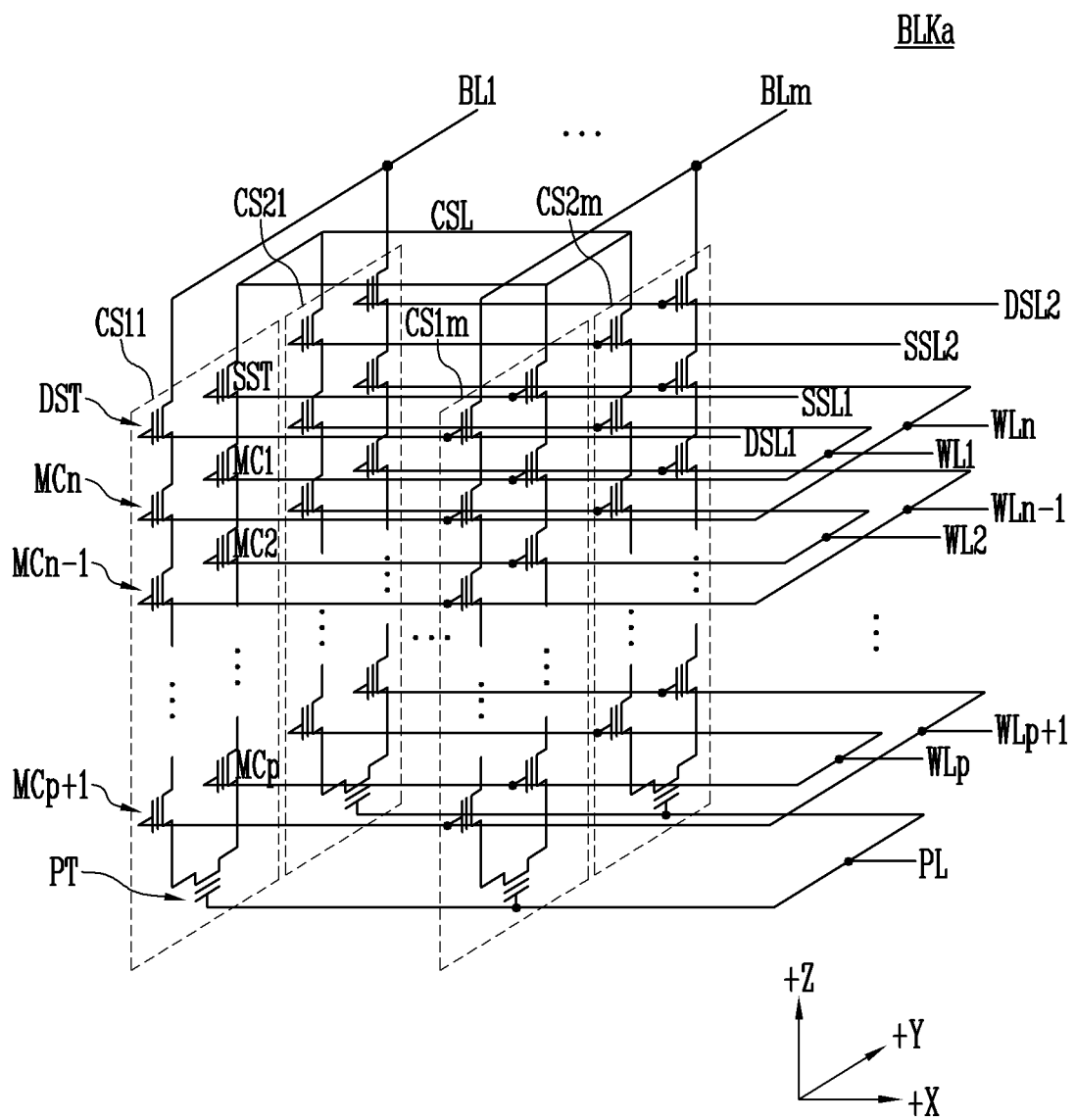
FIG. 4 is a circuit diagram illustrating a representative memory block BLKa of memory blocks BLK1 to BLKz of FIG. 3, in accordance with an embodiment of the present disclosure.

FIG. 4 is a circuit diagram illustrating a representative memory block BLKa of memory blocks BLK1 to BLKz of FIG. 3, in accordance with an embodiment of the present disclosure.

Figure 5:
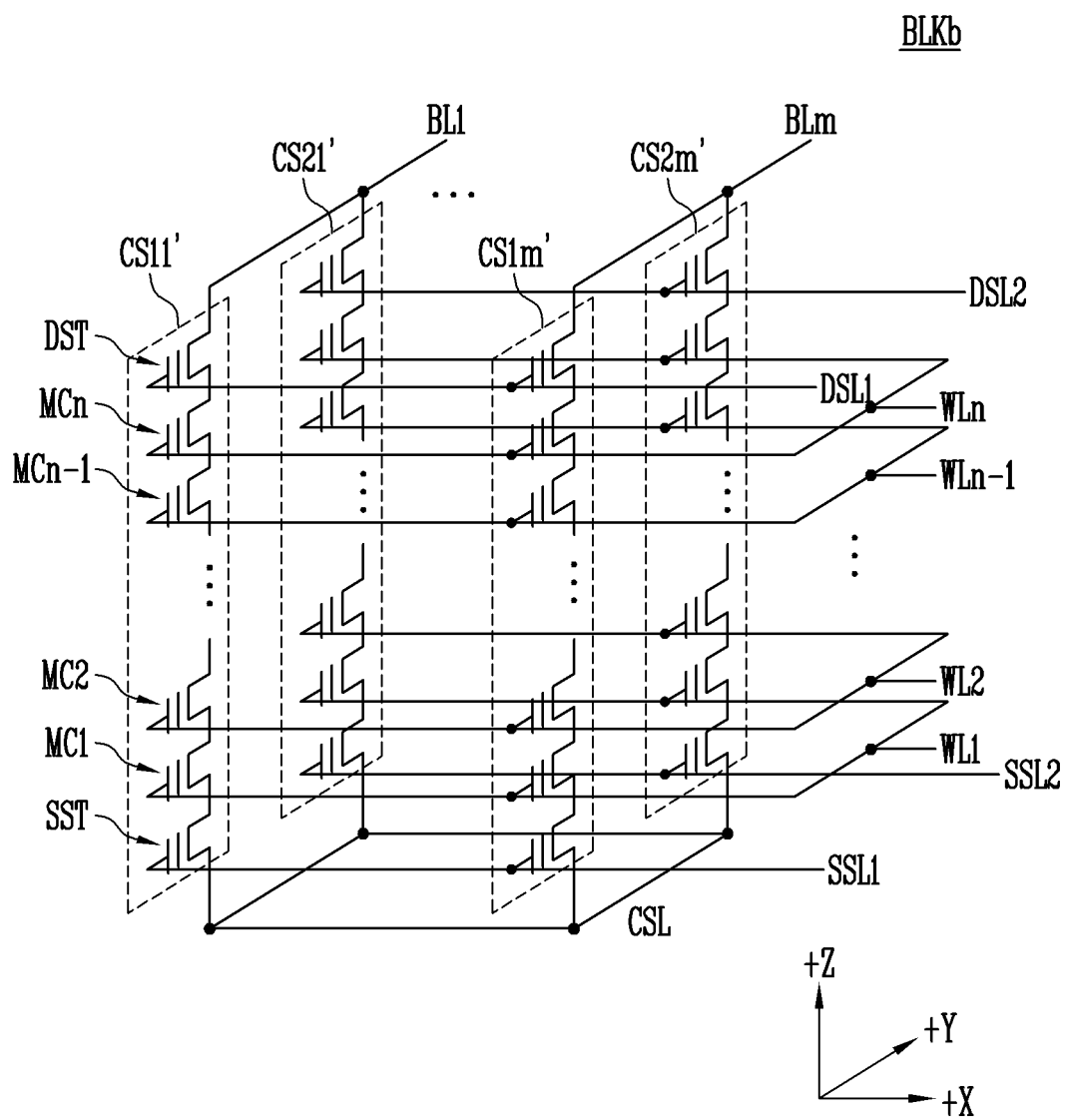
FIG. 5 is a circuit diagram illustrating a representative memory block BLKb of the memory blocks BLK1 to BLKz of FIG. 3, in accordance with an embodiment of the present disclosure.

Referring to FIG. 4, the memory block BLKa may include a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings may be arranged in a row direction (i.e., the +X direction). In FIG. 5, two cell strings are illustrated as being arranged in a column direction (i.e., the +Y direction). However, this illustration is for clarity; it will be understood that three or more cell strings may be arranged in the column direction.

In an embodiment, each memory block may include a plurality of sub-blocks. Each sub-block may include cell strings arranged in a 'U' shape in each column.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 5, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 5, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to the respective even bit lines. Odd-number-th cell strings of the cell strings CS11 to CS1m or CS21 to CS2m arranged in the row direction may be coupled to the respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCp. Alternatively, dummy memory cell(s) may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the dummy memory cell(s), each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

FIG. 5 is a circuit diagram illustrating a representative memory block BLKb of the memory blocks BLK1 to BLKz of FIG. 3, in accordance with an embodiment of the present disclosure.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLK1'.

In an embodiment, each memory block may include a plurality of sub-blocks. Each sub-block may include cell strings arranged in a 'I' shape in each column.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequently, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCn. Alternatively, dummy memory cell(s) may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the dummy memory cell(s), each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6A:
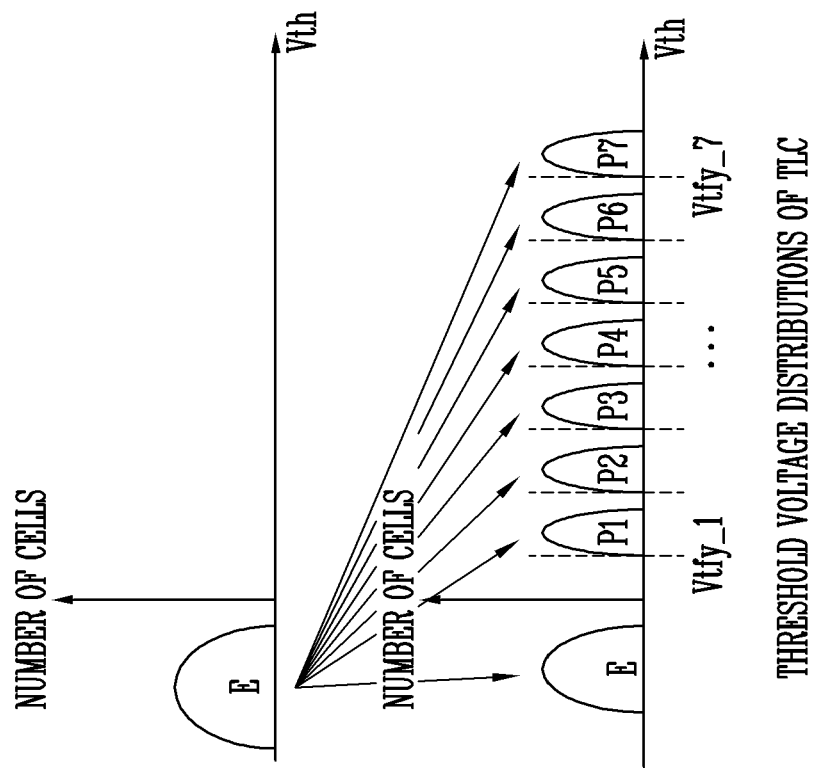
FIGS. 6A and 6B are diagrams illustrating an embodiment of a program operation of the memory device.
Figure 6B:
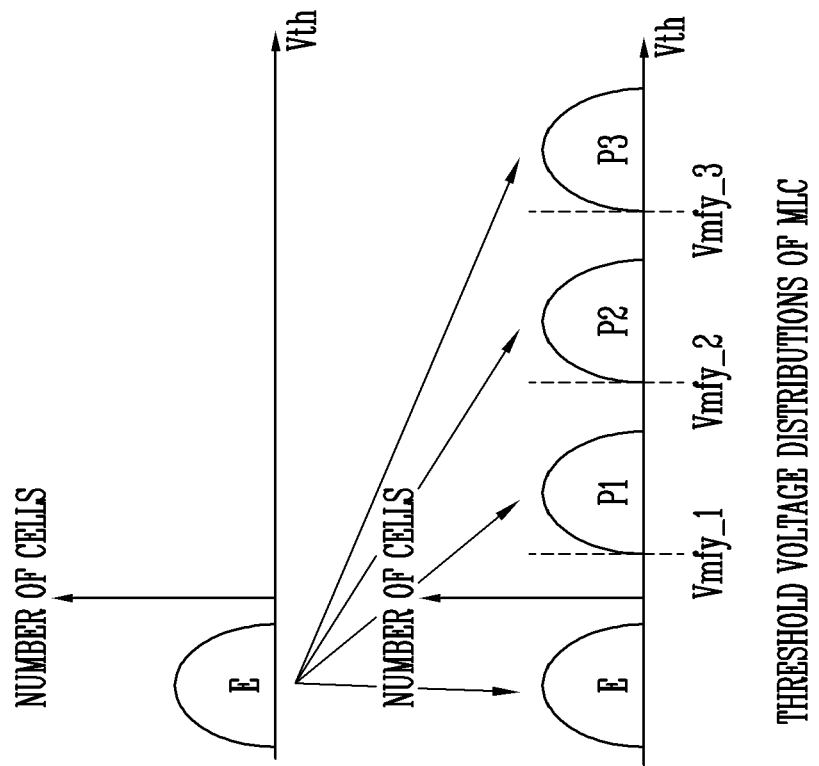

FIGS. 6A and 6B are a diagram illustrating an embodiment of a program operation of the memory device.

Referring to FIGS. 6A and 6B, there is illustrated a program operation on an MLC and a TCL respectively. The program operation may include storing data in memory cells coupled in common to a selected word line.

In more detail, FIG. 6A is a diagram illustrating a threshold voltage distribution of MLC memory cells each of which can store 2-bit data when a program operation is performed.

FIG. 6B is a diagram illustrating a threshold voltage distribution of TLC memory cells each of which can store 3-bit data when a program operation is performed.

Referring to FIG. 6A, each of the MLC memory cells may have an erased state E or any one of first to third programmed states P1 to P3 as a target programmed state. The target programmed state may be determined depending on data to be stored in each memory cell. Each of the MLC memory cells may be in the erased state E before a program operation is performed. Thereafter, as the program operation is performed, each of the MLC memory cells may reach the target programmed state. The program operation may be performed on each page including a plurality of memory cells coupled to one word line. The memory cell array may include a plurality of pages. A page to be programmed among the plurality of pages may be determined based on an address. If the program operation on the corresponding page is terminated, a program operation on a subsequent page may be performed. The program operation may include a program voltage application operation and a verify operation. The program voltage application operation may be an operation of applying a program voltage $Vp(x)$ to a selected word line that is coupled in common to memory cells included in the corresponding page on which the program operation is to be performed. The verify operation may be an operation of verifying a program result using a verify voltage. Memory cells each having a first programmed state P1 as a target programmed state may be memory cells on which a verify operation using a first multi-verify voltage $Vmfy\_1$ has passed. Memory cells each having a second programmed state P2 as a target programmed state may be memory cells on which a verify operation using a second multi-verify voltage $Vmfy\_2$ has passed. Memory cells each having a third programmed state P3 as a target programmed state may be memory cells on which a verify operation using a third multi-verify voltage $Vmfy\_3$ has passed. If all of the memory cells coupled to the selected word line reaches the target programmed states, the program operation on the select word line may be regarded as having been terminated.

Referring to FIG. 6B, each of the TLC memory cells may have an erased state E or any one of first to seventh programmed states P1 to P7 as a target programmed state. Although a method of performing a program operation is similar to that of FIG. 6A, the number of threshold voltage distributions to be generated in the program operation on the TLC memory cells is greater than that of the program operation on MLC memory cells because each TLC memory cell can store 3-bit data. In other words, referring to FIGS. 6A and 6B, when the program operation on the MLC memory cells is completed, a total four threshold voltage distributions are generated. However, when the program operation on the TLC memory cells is completed, a total eight threshold distributions may be generated. Although the amount of data that can be stored in a TLC memory cell is greater than the amount of data that can be stored in an MLC memory cell, a program time TPGM for TLC memory cells may be longer than that of MCL memory cells because the number of threshold voltage distributions required to be generated for the TLC memory cells is greater than that of the MLC memory cells. In accordance with an embodiment of the present disclosure, the program time TPGM may be reduced to enhance the program performance. Although in the following embodiment it will be assumed that memory cells are TLC memory cells for the sake of explanation, the present invention is not limited thereto. In other words, embodiments of the present invention may be applied to a single-level cell capable of storing 1-bit data, a multi-level cell capable of storing 2-bit data, and a quad-level cell capable of storing 4-bit data. In addition, a memory cell capable of storing a larger number of bits may be used.

Figure 7:
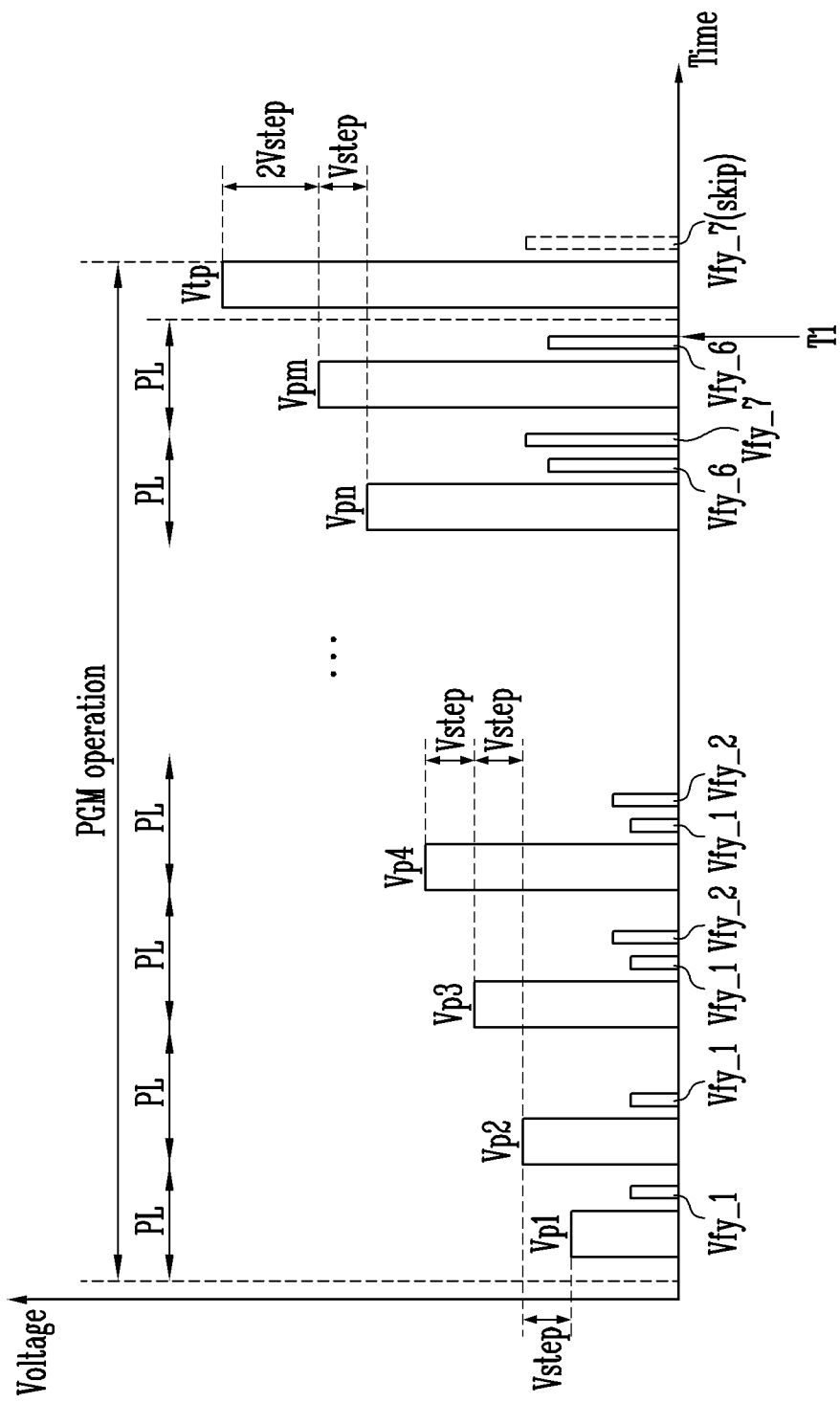
FIG. 7 is a diagram for describing a process of performing a program operation in accordance with an embodiment of the present disclosure.

FIG. 7 is a diagram for describing a process of performing a program operation in accordance with an embodiment.

Referring to FIG. 7, a memory cell on which a program operation is to be performed may have any one of first to seventh programmed states P1 to P7 as a target programmed state.

The program operation may be an operation of increasing a threshold voltage of a memory cell. The program operation may be performed by iteration of at least one program loop PL. Each program loop may include a program voltage application operation of applying a program voltage and a verify operation of determining whether the threshold voltage of the memory cell exceeds a verify voltage using a verify voltage. The program voltage application operation may be an operation of increasing the threshold voltage of the memory cell. The verify operation may be an operation of checking the threshold voltage of the corresponding memory cell and determining whether the memory cell has reached a target programmed state. At each iteration of the program loop, the level of the program voltage to be applied to the selected word line may increase by a predetermined step voltage Vstep. This scheme is referred to as the "incremental step pulse program (ISPP) scheme".

In detail, a program operation may be performed on memory cells coupled to a selected word line in response to a program command provided by the memory controller 200 described with reference to FIG. 1. The memory cells coupled to the selected word lines may be in an erased state E before the program operation is performed. As the program operation is performed, threshold voltage distributions of the memory cells may be shifted. In other words, threshold voltage distributions of memory cells having the first to seventh programmed states P1 to P7 as target programmed states, other than memory cells that remain in the erased state E, may be shifted.

Detailed description of performing a program operation on a selected word line in accordance with an embodiment is given below. To perform a program operation, a program loop may be performed on memory cells each having a first programmed state P1 as a target programmed state. The voltage of a bit line coupled to memory cells each having the first programmed state P1 as the target programmed state may be set to a program enable voltage (e.g., a ground voltage). If a first program voltage Vp1 is applied to the selected word line, the corresponding memory cells may be programmed. Subsequently, a verify operation of verifying a result of programming the memory cell to the first programmed state P1 may be performed. During the verify operation, a first verify voltage Vfy_1 may be applied to the selected word line. Thereby, it may be sensed whether the threshold voltage of the memory cell is greater than the verify voltage. For example, if the result of the sensing indicates 1, this may mean that the threshold voltage of the memory cell is lower than the first verify voltage Vfy_1. If it is determined that the threshold voltage of the memory cell having the first programmed state P1 as the target programmed state is lower than the first verify voltage Vfy_1, this may indicate that the program operation has failed. If the result of the sensing indicates 0, this may mean that the threshold voltage of the memory cell is greater than the first verify voltage Vfy_1. If it is determined that the threshold voltage of the memory cell having the first programmed state P1 as the target programmed state is higher than the first verify voltage Vfy_1, this may indicate that the program operation has passed.

If a result of the verify operation indicates that the program operation has failed for the first programmed state P1, a subsequent program loop PL may be performed. The voltage of the bit line coupled to the memory cell on which the program operation has failed may be set to a program enable voltage. In the subsequent program loop PL, a program voltage higher by a step voltage Vstep than the program voltage applied to the selected word line in the previous program loop PL may be applied to the selected word line. In the ISPP scheme, a second program voltage Vp2 higher by the step voltage Vstep than the first program voltage Vp1 that has been applied to the selected word line in the previous program loop PL may be applied to the selected word line. Vstep may be a fixed size. After the second program voltage Vp2 has been applied, the verify operation of checking whether the memory cell has been programmed to the first programmed state P1 may be performed again. In the same manner as the previous verify operation, the first verify voltage Vfy_1 may be applied to the selected word line. Hence, the threshold voltage of the memory cell may be sensed. In an embodiment, the size of the step voltage Vstep of the increment of the program voltage that increases each time the program loop PL is iterated may be varied. For example, in the previous program loops PL, it is assumed that program voltages increase by a single unit of the step voltage Vstep each program loop have been applied. If a result of performing the verify operation indicates that the program operation has failed, a program voltage that increases by 2 units of the step voltage Vstep rather than the single unit of the step voltage Vstep depending on the state of the memory cell may be applied to the selected word line in a subsequent program loop PL unlike the previous program loops PL.

In an embodiment, a verify operation performed in each program loop PL may uses two or more verify voltages. In other words, after a program voltage has been applied, memory cells having two or more programmed states as target programmed states may be verified. For example, after a third program voltage Vp3 has been applied to the selected word line, a verify operation for the first programmed state P1 and the second programmed state P2 may be performed. To verify a result of the program operation for the first programmed state P1, a first verify voltage Vfy_1 may be applied to the selected word line. Hence, the threshold voltage of the memory cell may be sensed. Subsequently, to verify a result of the program operation for the second programmed state P2, a second verify voltage Vfy_2 may be applied to the selected word line. Hence, the threshold voltage of the memory cell may be sensed. If the result of the sensing indicates 1, the program operation may be regarded as having failed. In this case, the program voltage to be applied to the selected word line may increase by a step voltage Vstep, and then a subsequent program loop PL may be performed.

If the verify operation of checking the programmed state using the verify voltage is repeatedly performed, the time taken to complete the program operation may be increased. In the case of a TLC, the time taken to complete the program operation may represent the time taken to perform the program operation until each memory cell reaches the target programmed state. In other words, the time taken to complete the program operation may indicate the time taken to perform the program operation on the memory cells having the first programmed state P1 as the target programmed state until the verify operation for the first programmed state P1 passes and likewise perform the program operation on the memory cells until it is determined that the verify operations for the second to seventh programmed states P2 to P7 have passed. Alternatively, the time taken to complete the program operation may represent the time from the start of the program operation to the time at which programming memory cells having the seventh programmed state P7 as the target programmed state is completed. If, with regard to a page on which the program operation is to be performed, the program operation corresponding to the first to seventh programmed states P1 to P7 is completed, a program operation on a subsequent page may start.

As a result of performing the program voltage application operation and the verify operation, a memory cell that is determined to have passed the verification of the program operation is no longer programmed in subsequent program loops PL. Therefore, before a program voltage is applied in a subsequent program loop PL, a program inhibit voltage (e.g., a power supply voltage) may be applied to a bit line coupled to the memory cell that has passed the verification operation. The memory cell coupled to the bit line to which the program inhibit voltage has been applied may not be programmed even if a program voltage is applied to the corresponding word line. Hence, over-program can be prevented.

In an embodiment, while a program operation is performed on memory cells having the most significant programmed state as a target programmed state, a voltage to be applied to the selected word line may be a single program pulse. After the single program pulse has been applied, a verify operation on the memory cells having the most significant programmed state as the target programmed state may be skipped, i.e., no performed. In other words, the program operation on the memory cells having the most significant programmed state as the target programmed state may be terminated after performing only an operation of applying a single program pulse rather than performing two or more program loops. Here, the single program pulse may be applied to the selected word line in response to a signal indicating that a verify operation for a programmed state adjacent to the most significant programmed state has passed. Hereinafter, a single program pulse may be defined as a target voltage pulse Vtp. In this disclosure, the most significant programmed state means a state identical or corresponding to a last programmed state or a programmed state corresponding to the highest threshold voltage level among the programmed states. For example, referring to FIG. 6B, in the case of a TLC memory cell, the most significant programmed state may correspond to the seventh programmed state P7. In the case of an MLC memory cell, the most significant programmed state may correspond to the third programmed state P3 of FIG. 6A. Referring to FIG. 6B, in the case of a TLC memory cell, the programmed state adjacent to the most significant programmed state may correspond to the sixth programmed state P6. In the case of an MLC memory cell, the programmed state adjacent to the most significant programmed state may correspond to the second programmed state P2 of FIG. 6A.

The memory device in accordance with an embodiment is described in detail. In the same manner as the above-mentioned scheme, a program operation may be performed on memory cells having any one of the first to seventh programmed states P1 to P7 as the target programmed state. Program loops each having a program voltage application operation and a verify operation may be repeatedly performed on memory cells having any one of the first to sixth programmed states P1 to P6 as the target programmed state. The following description is given on the assumption that all memory cells having first to fifth programmed states P1 to P5 as the target programmed state have passed verify operations.

Referring to FIG. 7, memory cells having the sixth programmed state P6 and the seventh programmed state P7 as the target programmed state may be programmed. In detail, an n-th program voltage Vpn may be applied to the selected word line. Subsequently, a verify operation may be performed using a sixth verify voltage Vfy_6 and a seventh verify voltage Vfy_7. Alternatively, a verify operation may be performed using only the sixth verify voltage Vfy_6. If as a result of performing the verify operation indicate that the program operation has failed, a subsequent program loop PL may be performed. Since it has been determined that the program operation has failed, a program enable voltage may be applied to bit lines respectively coupled to the memory cells having the sixth programmed state P6 and the seventh programmed state P7 as the target programmed states. Alternatively, a program enable voltage may be applied to bit lines respectively coupled to memory cells having only the sixth programmed state P6 as the target programmed state. An m-th program voltage Vpm may be applied to the selected word line. The m-th program voltage Vpm may have a level higher by a step voltage Vstep than the program voltage Vpn applied in the previous program loop PL. A verify operation may be performed using a sixth verify voltage Vfy_6 and a seventh verify voltage Vfy_7. Alternatively, a verify operation may be performed using only the sixth verify voltage Vfy_6. At time T1, it is assumed that the verify operation using the sixth verify voltage Vfy_6 has passed.

After time T1, memory cells on which the program operation has not yet been completed may be memory cells having the seventh programmed state P7 as the target programmed state because the verify operation of the memory cells having the sixth programmed state P6 as the target programmed state has passed.

In an embodiment, if it is determined that the verify operation for the sixth programmed state P6 has passed, a program loop PL may not be performed in the program operation on the memory cells having the seventh programmed state P7 as the target programmed state. In other words, the program loop PL may include the program voltage application operation and the verify operation, but if the verify operation for the sixth programmed state P6 has passed, the verify operation for the seventh programmed state P7 may be skipped. In response to a result of determining that the verify operation for the sixth programmed state P6 has passed, a target voltage pulse Vtp may be applied to the selected word line, and the program operation may be terminated. The target voltage pulse Vtp may be a program pulse allowing each of the memory cells having the last programmed state as the target programmed state to have a threshold voltage equal to or greater than a threshold voltage corresponding to the last programmed state. The previously-applied program voltages Vp(x) increase by the step voltage Vstep each time the program loop is performed, but in each subsequent program loop the increment of the target voltage pulse Vtp may be greater than the increment in the previous program loop PL. For example, the size of the target voltage pulse Vtp may correspond to a value obtained by adding a double-step voltage 2Vstep to the program voltage Vpm applied in the previous program loop. Alternatively, the size of the target voltage pulse Vtp may correspond to a value obtained by adding a triple-step voltage 3Vstep to the program voltage Vpm applied in the previous program loop. In other words, with regard to the memory cells having the last programmed state as the target programmed state, a program voltage having a level markedly higher than the previous program voltages Vp(x) may be applied to the selected word line. After the target voltage pulse Vtp has been applied to the selected word line so as to program the memory cells to the seventh programmed state P7 that is the last programmed state, a verify operation for the last programmed state may be skipped. Since the verify operation is skipped, the program loops may no longer be performed, so that the entire program time may be reduced. In other words, the program speed may be improved. Even if the verify operation for the last programmed state is skipped, the reliability of the last programmed state may be secured because the target voltage pulse Vtp having a markedly high level is applied to the selected word line.

In an embodiment, after the program operation has been performed on the memory cells having the first to sixth programmed states P1 to P6 as the target programmed states, the program operation may be terminated. For the memory cells having the seventh programmed state P7 that is the last programmed state as the target programmed state, the target voltage pulse Vtp that is an additional program voltage pulse may be applied to the corresponding word line. In other words, for the memory cells having the seventh programmed state P7 that is the last programmed state as the target programmed state, the target voltage pulse Vtp that is an additional program voltage pulse may be applied to the corresponding word line once. Thereafter, the program operation on the corresponding word line may be terminated.

In an embodiment, the program operation may be performed on memory cells such that the memory cells belong to the threshold voltage distribution of a programmed state adjacent to the most significant programmed state. The program operation may be performed by iteration of a plurality of program loops PL. Each time a program loop PL is iterated, the program voltage may increase by the step voltage Vstep. If it is determined that a verify operation for the programmed state adjacent to the most significant programmed state has passed, the program operation may be performed on the memory cells having the most significant programmed state as the target programmed state. Here, the target voltage pulse Vtp may be applied to the selected word line. In an embodiment, the number of times the target voltage pulse Vtp is applied to the selected word line may be one. The level of the target voltage pulse Vtp may be greater by a double-step voltage 2Vstep than the level of the program voltage applied to the selected word line in the last program loop PL among the programmed loops PL of the programmed state adjacent to the most significant programmed state. In other words, when the program operation is performed on the memory cells having the most significant programmed state as the target programmed state, the target voltage pulse Vtp having a level markedly higher than the voltage applied to the word line in the previous program loop may be applied to the selected word line.

Figure 8:
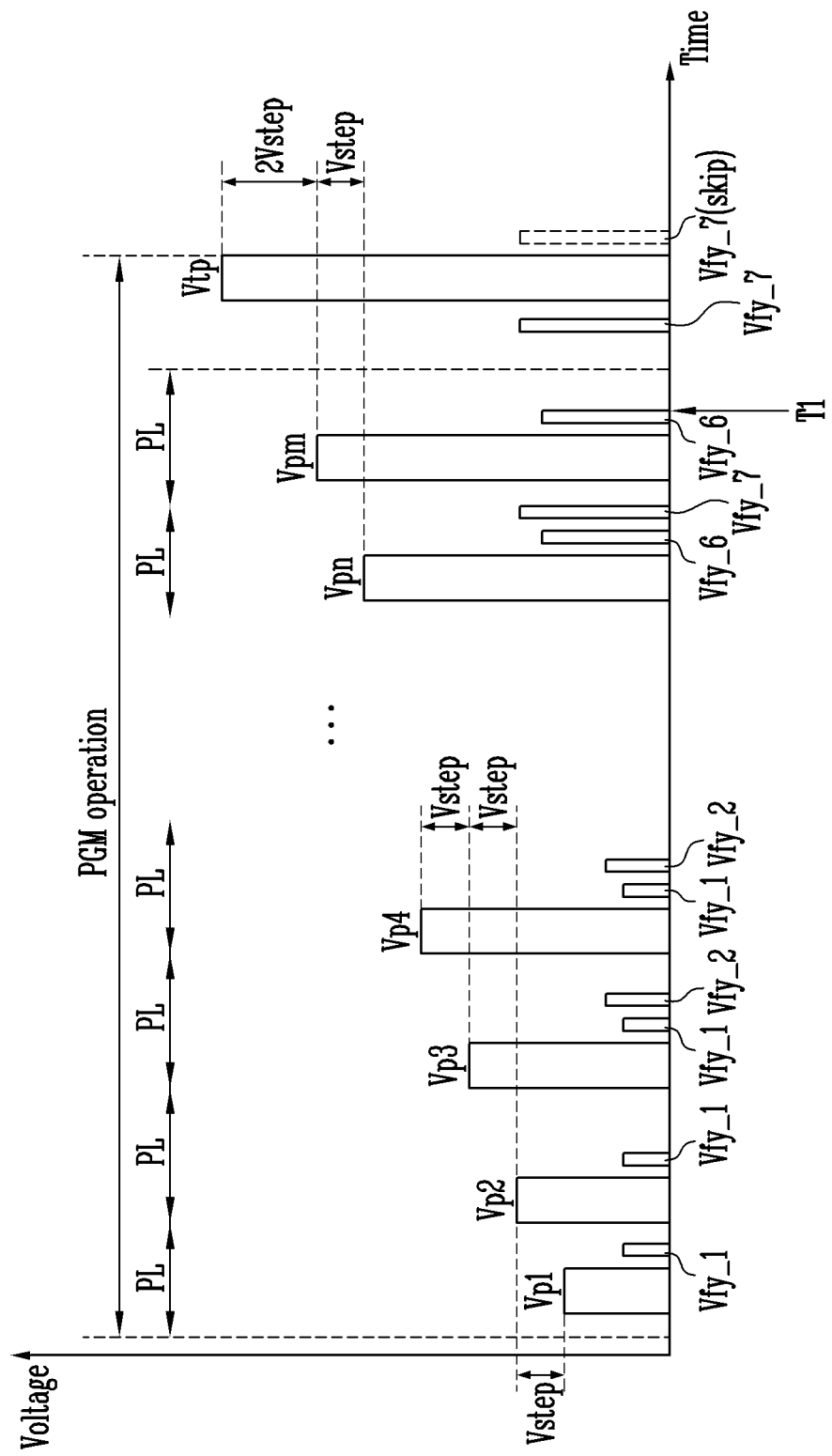
FIG. 8 is a diagram for describing a process of performing a program operation in accordance with an embodiment of the present disclosure.

FIG. 8 is a diagram for describing a process of performing a program operation in accordance with an embodiment.

Referring to FIG. 8, the program operation may be performed in a manner similar to that described with reference to FIG. 7. Hence, the following description with reference to FIG. 8 focuses on differences from the embodiment of FIG. 7.

In detail, referring to FIG. 8, the program operation may be in a state in which all of the verify operations for the first to fifth programmed states P1 to P5 have passed. Hence, program loops PL may be repeatedly performed on memory cells having the sixth programmed state P6 as the target programmed state. At time T1, it is assumed that as a result of performing the verify operation using the sixth verify voltage Vfy_6, the verify operation has passed. In response to a signal indicating that the verify operation for the sixth programmed state P6 has passed, a verify operation using a seventh verify voltage Vfy_7 may be performed at least once, and a target voltage pulse Vtp may be applied to the selected word line.

As a result of performing the verify operation using the seventh verify voltage Vfy_7, the memory cells may be classified into memory cells that have passed the verify operation and memory cells that have failed the verify operation. The threshold voltage of a memory cell that has passed the verify operation may be higher than the seventh verify voltage Vfy_7. The threshold voltage of a memory cell that has failed the verify operation may be lower than the seventh verify voltage Vfy_7. In an embodiment, the threshold voltage of the memory cell that has failed the verify operation using the seven verify voltage Vfy_7 may be increased. In detail, a program enable voltage (e.g., the ground voltage) may be applied to a bit line coupled to the memory cell that has failed the verify operation using the seventh verify voltage Vfy_7, and the target voltage pulse Vtp may be applied to the selected word line. On the other hand, the threshold voltage of the memory cell that has passed the verify operation using the seventh verify voltage Vfy_7 may not be increased. In detail, a program inhibit voltage (e.g., the power supply voltage) may be applied to a bit line coupled to the memory cell that has passed the verify operation using the seventh verify voltage Vfy_7. Therefore, even if the target voltage pulse Vtp is applied to the selected word line, the threshold voltage may not be increased. In an embodiment, the distribution of the seventh programmed state P7 may be formed to have a reduced width. The target voltage pulse Vtp is the same as that described with reference to FIG. 7. In other words, the target voltage pulse Vtp may be a single program pulse having a markedly high level. Although the program voltage Vp(x) increases by a level of Vstep from a previous program loop PL, the target voltage pulse Vtp may have a level higher by 2Vstep or 3Vstep than the program voltage applied to the selected word line in the previous program loop PL. Referring to FIG. 8, the program operation may terminated without performing a verify operation of verifying the seventh programmed state P7 that is the last programmed state. In other words, only one verify operation that is performed before the application of the program pulse may be performed on memory cells having the last programmed state as the target programmed state. Alternatively, the sequence of the program voltage application operation and the verify operation may be regarded as being reversed. For example, the verify operation using the seventh verify voltage Vfy_7 may be first performed and then, as a result of the verify operation, the target voltage pulse Vtp which is an additional voltage pulse may be applied to the selected word line, rather than the manner in which memory cells are programmed to the seventh programmed state P7 and then a verify operation is performed using the seventh verify voltage Vfy_7 that is a threshold voltage corresponding to the seventh programmed state P7. As a further alternative, the verify operation for the last programmed state may be skipped.

In embodiments illustrated in FIGS. 7 and 8, the program operation may be terminated before the program operation is performed on the memory cells having the last programmed state as the target programmed state. Only the target voltage pulse Vtp, which is an additional voltage pulse, may be applied to the memory cells having the last programmed state as the target programmed state.

Figure 9A:
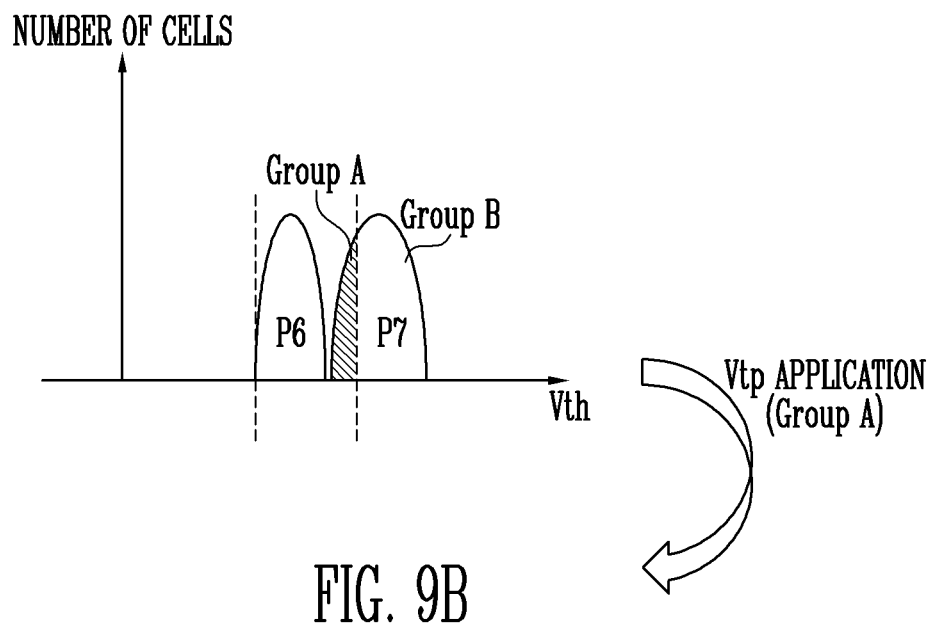
FIGS. 9A and 9B are diagrams for describing in more detail an operation of applying a target voltage pulse Vtp described with reference to FIG. 8.
Figure 9B:
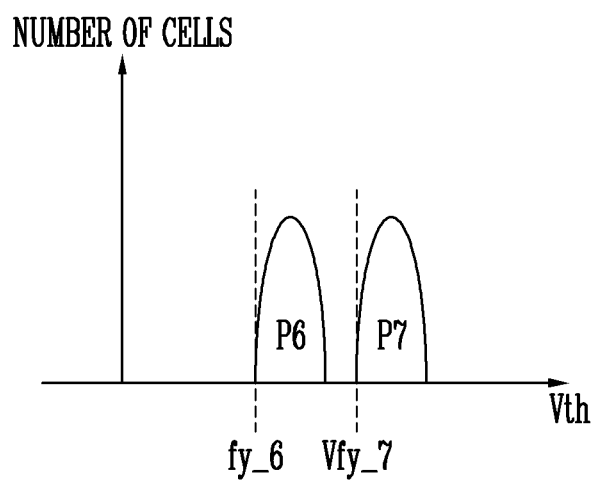

FIGS. 9A and 9B are diagrams for describing in more detail an operation of applying a target voltage pulse Vtp described with reference to FIG. 8.

The memory cells may include a fast cell and a slow cell. The threshold voltage of the fast cell may be more easily increased compared to the threshold voltage of the slow cell. For example, when program voltages having the same level are applied to the fast cell and the slow cell, the threshold voltage of the fast cell may be increased by a relatively high value, and the threshold voltage of the slow cell may be increased by a relatively low value. In other words, if the program operation is performed taking into account the fact that memory cells have different characteristics, threshold voltage distributions may be formed to have reduced widths. Hence, the program efficiency may be improved.

Referring to FIGS. 9A and 9B, there is illustrated the case where a verify operation on memory cells having the first to fifth programmed states P1 to P5 as the target programmed states has passed. Hence, a program voltage may be applied to memory cells having the sixth programmed state P6 and the seventh programmed state P7 as the target programmed states.

Referring to FIG. 9A, there is illustrated a state in which a verify operation for the sixth programmed state P6 has passed as a plurality of program loops PL each including a program voltage application operation and a verify operation. In other words, as a result of performing the verify operation using the sixth verify voltage Vfy_6, memory cells may be sensed as 0. Thereafter, a verify operation using the seventh verify voltage Vfy_7 may be directly performed without application of a program voltage. As a result of the verify operation, some of the memory cells having the seventh programmed state P7 as the target programmed state may be sensed as belonging to group A. Some of the memory cells may be sensed as belonging to group B. For example, the memory cells that belong to group A may be sensed as 1 because the threshold voltages thereof are lower than the seventh verify voltage Vfy_7. The memory cells that belong to group B may be sensed as 0 because the threshold voltages thereof are higher than the seventh verify voltage Vfy_7. The memory cells that belong to group B may no longer be programmed because the programmed state thereof has already reached the seventh programmed state P7 that is the target programmed state. On the other hand, memory cells that belong to group A need to be programmed because the threshold voltages thereof are lower than the threshold voltage corresponding to the seventh programmed state P7 that is the target programmed state. In other words, memory cells to which the target voltage pulse Vtp is to be applied may be determined based on a result of the sensing operation using the seventh verify voltage Vfy_7.

Referring to FIG. 9A, the target voltage pulse Vtp may be applied to only the memory cells that belong to group A. In more detail, a program enable voltage may be applied to bit lines coupled to the memory cells that belong to group A. A program inhibit voltage may be applied to bit lines coupled to the memory cells that belong to group B.

FIG. 9B is a diagram illustrating threshold voltage distributions after the application of the target voltage pulse Vtp. As described above, since only the target voltage pulse Vtp is applied to the corresponding memory cells and no verify operation of verifying whether the last programmed state has passed is performed (i.e., the verify operation is skipped), the entire program time may be reduced. In other words, in the embodiment of FIG. 9B, the program speed may be enhanced.

Figure 10:
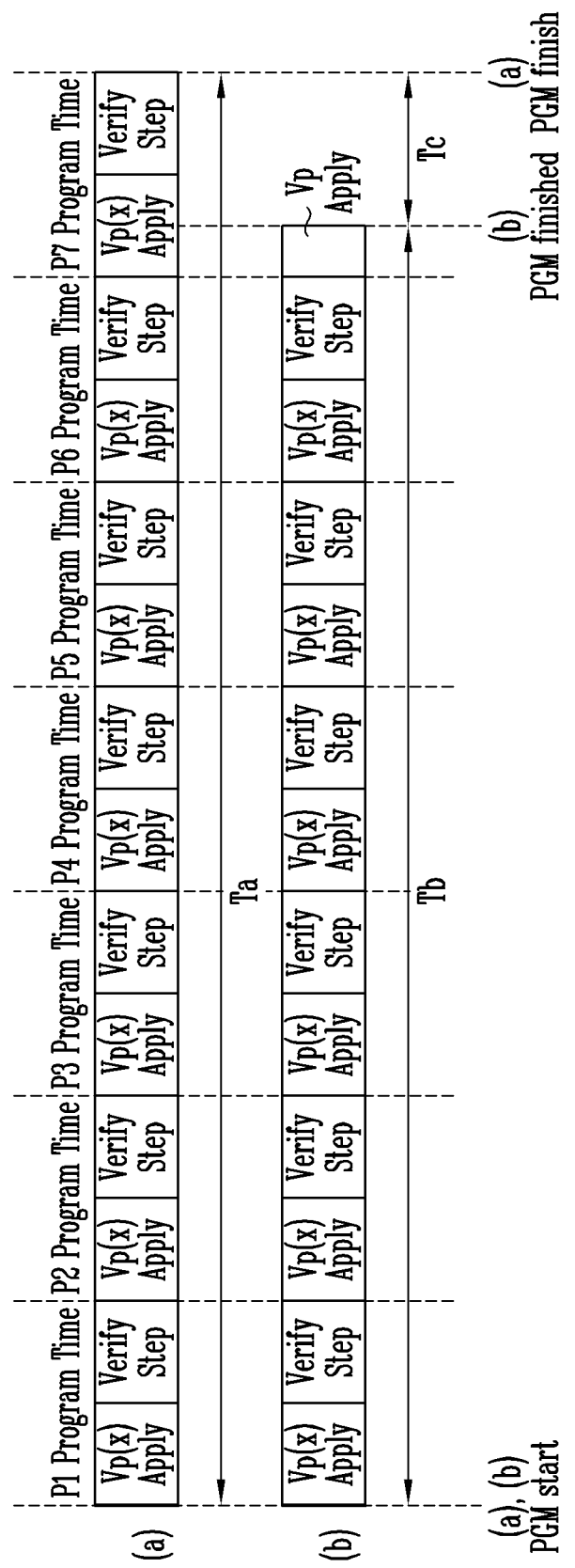
FIG. 10 is a diagram illustrating an improved program time TPGM in accordance with an embodiment of the present disclosure.

FIG. 10 is a diagram illustrating an improved program time TPGM in accordance with an embodiment.

Referring to FIG. 10, there is illustrated a program time needed to form distributions corresponding to respective programmed states. For the sake of explanation, the following description is given in the context of TLC memory cells.

Referring to FIG. 10, part (a), the program time may correspond to a time period Ta that is the sum of all of the time periods including a time period for which memory cells having the first programmed state P1 as the target programmed state are programmed to a time period for which memory cells having the seventh programmed state P7 as the target programmed state are programmed. For example, a time period (P1 Program Time) for which the memory cells having the first programmed state P1 as the target programmed state are programmed may include a time period Vp(x) for which a program voltage is applied to the selected word line, and a time period Verify Step for which a verify operation is performed. Likewise, each of the other time periods for which memory cells having the corresponding programmed state as the target programmed state are programmed may also include a time period Vp(x) and a time period Verify step. As the number of times verify operations have failed increases, the number of times program voltages are applied may also increase. In other words, as the number of times verify operations have been performed increases, the program time increases, thus leading to a reduction in program speed.

FIG. 10, part (b) illustrates a program time in accordance with an embodiment. Unlike the case of FIG. 10(a), in the case of FIG. 10(b), the verify operation for the last programmed state may be skipped. Therefore, the entire program time is represented by Tb. Not only may the verify operation for the last programmed state be skipped but a program pulse may also be applied to the selected word line only once. Consequently, the program time may be reduced. As such, the program pulse may be applied only once. In addition, the program pulse may be the above-described target voltage pulse Vtp that increases the threshold voltage of a memory cell to the most significant programmed state. Referring to FIG. 10(b), the program time may be reduced by the time period Tc compared to that of the case of FIG. 10(a). Referring to FIG. 10, compared to the case of FIG. 10(a), in the case of FIG. 10(b), the time taken to complete the program operation may be reduced (refer to "(b) PGM finished").

Figure 11:
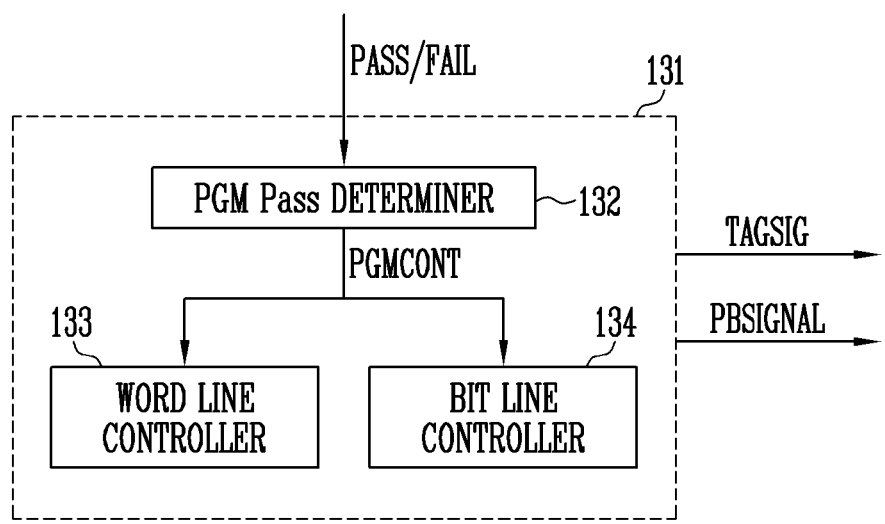
FIG. 11 is a block diagram illustrating an operation of a program operation controller, such as that of FIG. 2.

FIG. 11 is a block diagram illustrating an operation of the program operation controller 131 of FIG. 2.

Referring to FIG. 11, the program operation controller 131 may include a program pass determiner 132, a word line controller 133, and a bit line controller 134.

The program operation controller 131 may receive a signal indicating whether a program operation has passed from the sensing circuit 126 illustrated in FIG. 2. Based on a signal indicating whether a program operation for a programmed state preceding the last programmed state has passed, control signals for the target voltage pulse Vtp may be generated. Here, it is assumed that a program operation is performed on a TLC memory cell.

In detail, the program pass determiner 132 may receive a signal PASS indicating that the program operation for the programmed state preceding the last programmed state has passed. In other words, as a result of performing the program operation on memory cells having the sixth programmed state P6 as the target programmed state, a signal PASS indicating that the memory cells have passed a verify operation may be input to the program pass determiner 132. The program pass determiner 132 may provide a program control signal PGMCONT to the word line controller 133 and the bit line controller 134.

The word line controller 133 may provide a target voltage pulse generating signal TAGSIG to the voltage generator in response to the program control signal PGMCONT. The voltage generator may generate a target voltage pulse Vtp in response to the target voltage pulse generating signal TAGSIG. The generated target voltage pulse Vtp may be applied to a selected word line.

The bit line controller 134 may provide page buffer control signals PBSIGNALS for controlling voltages of the bit lines, in response to the program control signal PGMCONT. In response to the page buffer control signals PBSIGNALS, a program enable voltage may be applied to bit lines coupled to memory cells to which the target voltage pulse Vtp is to be applied among the memory cells coupled to the selected word line. In response to the page buffer control signals PBSIGNALS, a program inhibit voltage may be applied to bit lines coupled to memory cells to which the target voltage pulse Vtp is not to be applied among the memory cells coupled to the selected word line.

Figure 12:
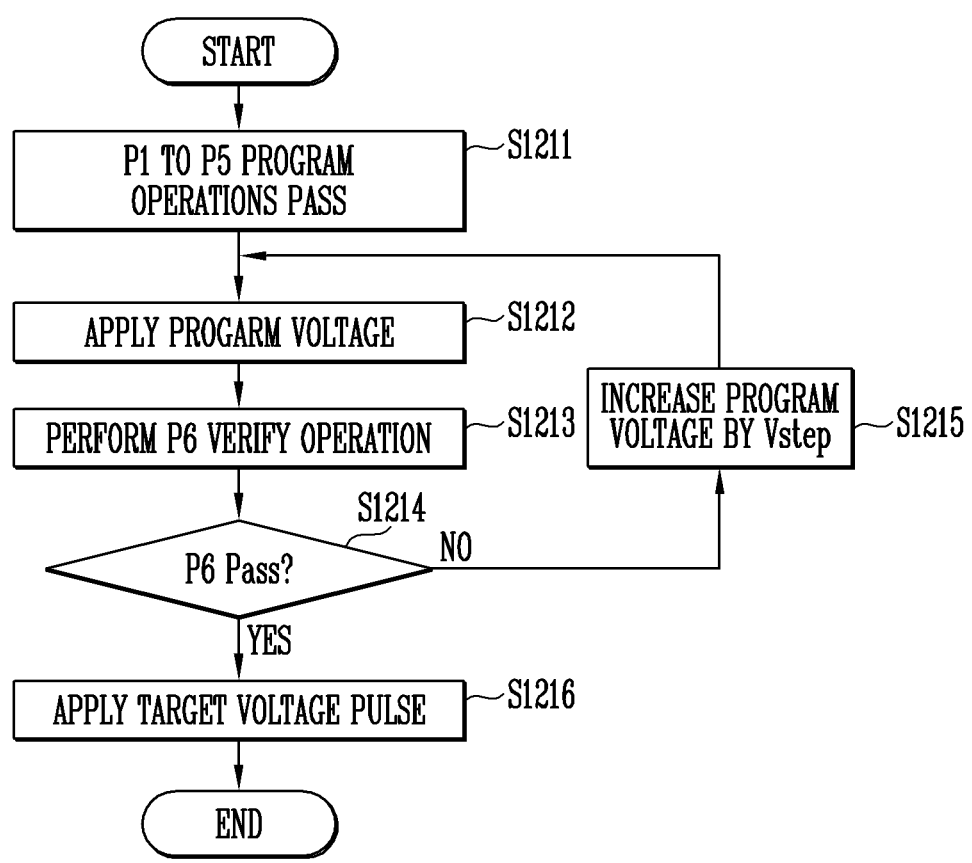
FIG. 12 is a flowchart for describing a method of operating the memory device in accordance with an embodiment of the present disclosure.

FIG. 12 is a flowchart for describing a method of operating the memory device in accordance with an embodiment.

At step S1211, on the assumption that memory cells are TLC memory cells, program operations may be performed on memory cells having the first to fifth programmed states P1 to P5 as the target programmed states. Each program operation may include one or more program loops. Each program loop may include a program voltage application operation and a verify operation. If it is determined that the program operation has failed the verify operation, the program voltage increases by a set step voltage Vstep, and then a subsequent program loop may be performed. The verify operation may be an operation of sensing data stored in a memory cell using a verify voltage. The verify operation may include a plurality of verify voltages. If the program operation on the memory cells having the first to fifth programmed states P1 to P5 as the target programmed states has passed, the process may proceed to step S1212.

At step S1212, a program voltage may be applied to memory cells having the sixth programmed state P6 as the target programmed state. In an embodiment, a program voltage may be applied to a selected word line coupled to memory cells having the sixth programmed state P6 or the seventh programmed state P7 as the target programmed state. During the application of the program voltage, a program enable voltage may be applied to a bit line coupled to a memory cell to which the program voltage is to be applied.

At step S1213, a verify operation may be performed on memory cells having the sixth programmed state P6 as the target programmed state. In detail, a verify voltage corresponding to the sixth programmed state P6 may be applied to the selected word line. Hence, a program result of the memory cells may be sensed.

At step S1214, it may be determined whether the sixth program operation has passed. Whether the program operation has passed may be determined by a result of sensing the memory cells after a verify voltage has been applied to the word line. If a result of the sensing indicates 1, it may be determined that the program operation has failed. On the other hand, if the result of the sensing indicates 0, it may be determined that the program operation has passed. If it is determined that the program operation failed, the process may proceed to step S1215. If it is determined that the program operation passed, the process may proceed to step S1216.

At step S1215, if it is determined that the program operation on memory cells having the sixth programmed state P6 as the target programmed state has failed, a subsequent program loop may be performed. In the subsequent program loop, a program voltage higher by a set step voltage Vstep than the voltage that was applied to the selected word line in the previous program loop may be applied to the selected word line. Therefore, an increased program voltage may be applied to memory cells that have relatively low program efficiency.

At step S1216, if it is determined that the program operation on memory cells having the sixth programmed state P6 as the target programmed state has passed, the program operation on the corresponding page may be terminated. Thereafter, the target voltage pulse Vtp may be applied to the selected word line, and a program operation may start on another page rather than the corresponding page. Alternatively, after it is determined that the program operation for the sixth programmed state P6 has passed, the target voltage pulse Vtp may be applied to the selected word line, and the program operation on the corresponding page may be terminated. The target voltage pulse Vtp may have a level greater than the program voltage that has increased by the step voltage Vstep in the previous program loop. For example, the level of the target voltage pulse Vtp may correspond to a value obtained by adding a double-step voltage 2Vstep to the program voltage applied to the selected word line in the previous program loop. Alternatively, the level of the target voltage pulse Vtp may correspond to a value obtained by adding a triple-step voltage 3Vstep to the program voltage. In other words, the target voltage pulse Vtp may have a level markedly higher than that of the program voltage applied in the previous program loop. When the target voltage pulse Vtp is applied, a program inhibit voltage may be applied to bit lines coupled to memory cells having the erased state E and the first to sixth programmed states P1 to P6 as the target programmed states. On the other hand, when the target voltage pulse Vtp is applied, a program enable voltage may be applied to bit lines coupled to memory cells having the seventh programmed state P7 as the target programmed state. A verify operation on the seventh programmed state P7 that is the last programmed state may be skipped. If the verify operation is skipped, a program loop may no longer be performed. Therefore, the entire program time may be reduced. In the memory device in accordance with an embodiment, the program speed may be increased, so that the program efficiency may be enhanced.

Figure 13:
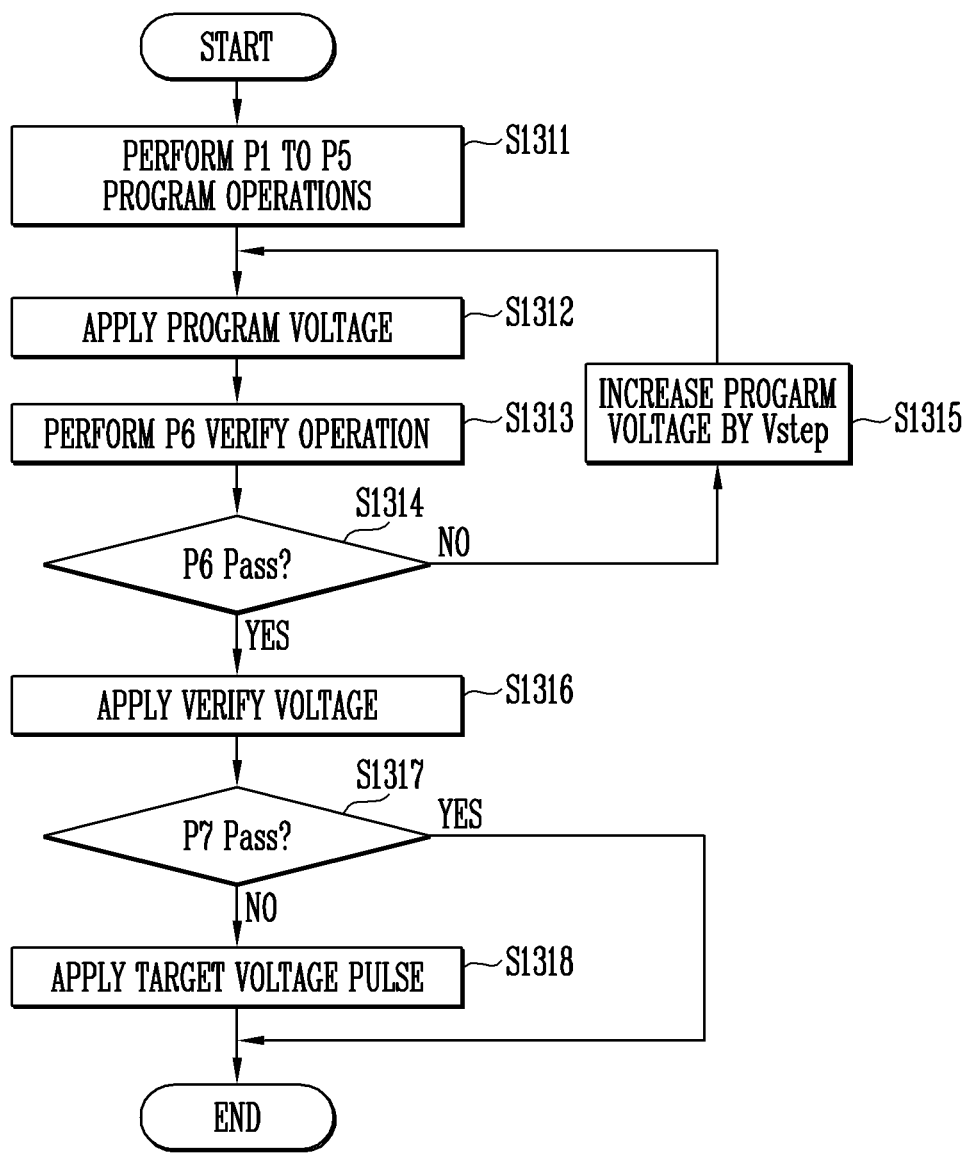
FIG. 13 is a flowchart for describing a method of operating the memory device in accordance with an embodiment of the present disclosure.

FIG. 13 is a flowchart for describing a method of operating the memory device in accordance with an embodiment.

Steps S1311 to S1315 correspond to steps S1211 to S1215 described with reference to FIG. 12; therefore, explanation thereof is omitted here. Hence, the following description with reference to FIG. 13 focuses on differences from the embodiment of FIG. 12.

At step S1316, a verify voltage may be applied to memory cells having the seventh programmed state P7 as the target programmed state. The level of the verify voltage may be a level that can check whether the threshold voltage of a memory cell has reached a threshold voltage distribution corresponding to the seventh programmed state P7. For example, the level of the verify voltage may correspond to the seventh verify voltage Vfy_7 described with reference to FIGS. 9A and 9B. The characteristics of the memory cells may differ from each other. The memory cells may include fast cells the threshold voltages of which are relatively easily increased, and slow cells the threshold voltages of which are not relatively easily increased. After the program operation for the sixth programmed state P6 has passed, only memory cells to be programmed to the seventh programmed state P7 may remain. Here, there may be a fast cell that has reached the seventh programmed state P7 among the remaining memory cells. To separate the fast cell that has reached the seventh programmed state P7 from the other remaining memory cells, a verify operation using a verify voltage may be performed before a program voltage for programming the memory cells to the seventh programmed state P7 is applied to the corresponding word line.

At step S1317, as a result of a verify operation for the seventh programmed state P7, it may be determined whether the program operation has passed. A program voltage may no longer be applied to the memory cells determined to have passed the verify operation for the seventh programmed state P7, and the corresponding program operation may be terminated. Here, an additional verify operation may be skipped. If it is determined that the verify operation for the seventh programmed state P7 has failed, the process may proceed to step S1318.

At step S1318, the target voltage pulse Vtp may be applied to memory cells that have not yet reached the seventh programmed state P7. The target voltage pulse Vtp may have a level greater than the program voltage that has increased by the step voltage Vstep in the previous program loop. For example, the level of the target voltage pulse Vtp may correspond to a value obtained by adding a double-step voltage 2Vstep to the program voltage applied to the selected word line in the previous program loop. Alternatively, the level of the target voltage pulse Vtp may correspond to a value obtained by adding a triple-step voltage 3Vstep to the program voltage. In other words, the target voltage pulse Vtp may be a voltage pulse having a level markedly higher than the program voltage applied in the previous program loop. When the target voltage pulse Vtp is applied, a program inhibit voltage may be applied to bit lines coupled both to memory cells having the erased state E, and the first to sixth programmed states P1 to P6 and to memory cells determined to have passed the verify operation for the seventh programmed state P7 at step S1317. On the other hand, when the target voltage pulse Vtp is applied, a program enable voltage may be applied to bit lines coupled to memory cells having the seventh programmed state P7 as the target programmed state. A verify operation on the seventh programmed state P7 that is the last programmed state may be skipped. If the verify operation is skipped, a program loop may no longer be performed. Therefore, the entire program time may be reduced.

Figure 14:
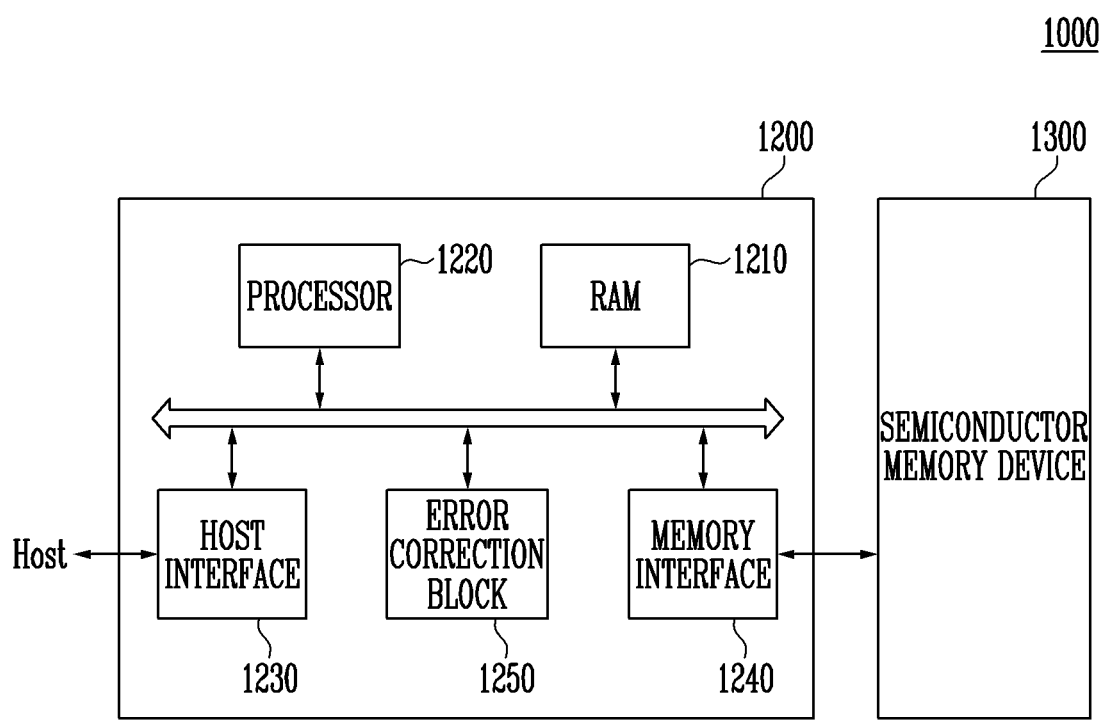
FIG. 14 is a block diagram illustrating a storage device including a memory device in accordance with an embodiment of the present disclosure.

FIG. 14 is a block diagram illustrating a storage device 1000 including the memory device in accordance with an embodiment of the present disclosure.

Referring FIG. 14, the storage device 1000 may include a semiconductor memory device 1300 and a controller 1200.

The semiconductor memory device 1300 may have the same configuration and operation as the semiconductor memory device described with reference to FIG. 1. Thus, detailed description of such semiconductor memory device is omitted here.

The controller 1200 is coupled to a host and the semiconductor memory device 1300. The controller 1200 may access the semiconductor memory device 100 in response to a request from the host. For example, the controller 1200 may control a read operation, a write operation, an erase operation, and a background operation of the semiconductor memory device 1300. The controller 1200 may provide an interface between the semiconductor memory device 1300 and the host. The controller 1200 may drive firmware for controlling the semiconductor memory device 1300.

The controller 1200 may include a random access memory (RAM) 1210, a processor 1220, a host interface 1230, a memory interface 1240, and an error correction block 1250.

The RAM 1210 is used as an operating memory for the processor 1220, a cache memory between the semiconductor memory device 1300 and the host, and/or a buffer memory between the semiconductor memory device 1300 and the host.

The processor 1220 may control the overall operation of the controller 1200. The processor 1220 may control a read operation, a program operation, an erase operation, and a background operation of the semiconductor memory device 1300. The processor 1220 may drive firmware for controlling the semiconductor memory device 1300. The processor 1220 may perform a function of a flash translation layer (FTL). The processor 1220 may translate a logical block address (LBA), provided by the host, into a physical block address (PBA) through the FTL. The FTL may receive the LBA and translate the LBA into the PBA using a mapping table. Various address mapping methods using the FTL may be employed depending on the unit of mapping. Representative address mapping methods include a page mapping method, a block mapping method, and a hybrid mapping method.

The processor 1220 may randomize data received from the host. For example, the processor 1220 may use a randomizing seed to randomize data received from the host. The randomized data is provided, as data to be stored, to the semiconductor memory device 1300 and is then programmed in the memory cell array.

The processor 1220 may derandomize data received from the semiconductor memory device 1300 during a read operation. For example, the processor 1220 may use a derandomizing seed to derandomize data received from the semiconductor memory device 1300. Derandomized data may be output to the host.

In an embodiment, the processor 1220 may drive software or firmware to perform the randomizing or derandomizing operation.

The host interface 1230 may include a protocol for performing data exchange between the host and the controller 1200. In an embodiment, the controller 1200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and/or a private protocol.

The memory interface 1240 may interface with the semiconductor memory device 1300. For example, the memory interface 1240 includes a NAND interface or a NOR interface.

The error correction block 1250 may use an error correcting code (ECC) to detect and correct error(s) in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

The controller 1200 and the semiconductor memory device 1300 may be integrated into a single semiconductor device. In an embodiment, the controller 1200 and the semiconductor memory device 1300 may be integrated into a single semiconductor device to form a memory card, such as a personal computer memory card international association (PCMCIA), a compact flash card (CF), a smart media card (SMC), a memory stick multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD may include a storage device configured to store data in a semiconductor memory. When the memory system is used as the SSD, an operation speed of the host coupled to the memory system 2000 may be improved.

In another embodiment, the storage device 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an REID device, one of various elements for forming a computing system, or the like.

In an embodiment, the semiconductor memory device 1300 or the storage device 1000 may be embedded in various types of packages. For example, the semiconductor memory device 1300 or the storage device 1000 may be packaged as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 15:
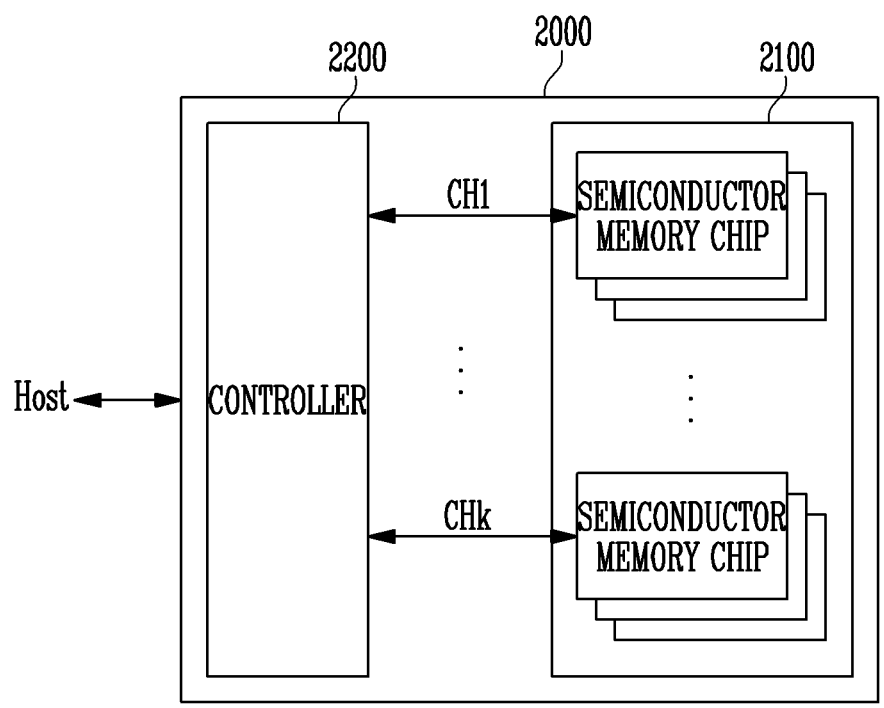
FIG. 15 is a block diagram illustrating an application example of the storage device of FIG. 14.

FIG. 15 is a block diagram illustrating an application example 2000 of the storage device of FIG. 14.

Referring FIG. 15, the storage device 2000 may include a semiconductor memory device 2100 and a controller 2200. The semiconductor memory device 2100 may include a plurality of memory chips. The semiconductor memory chips may be divided into a plurality of, e.g., k, groups, where k is an integer of 2 or more.

In FIG. 15, it is illustrated that the k groups respectively communicate with the controller 2200 through first to k-th channels CH1 to CHk. Each semiconductor memory chip may have the same configuration and operation as the memory device 100 described with reference to FIG. 1.

Each group may communicate with the controller 2200 through one common channel. The controller 2200 has the same configuration as that of the controller 1200 described with reference to FIG. 14 and is configured to control a plurality of memory chips of the semiconductor memory device 2100 through the plurality of channels CH1 to CHk.

In FIG. 15, a plurality of semiconductor memory devices are illustrated as being connected to each channel. However, the storage device 2000 may be modified such that a single semiconductor memory device is connected to each channel.

Figure 16:
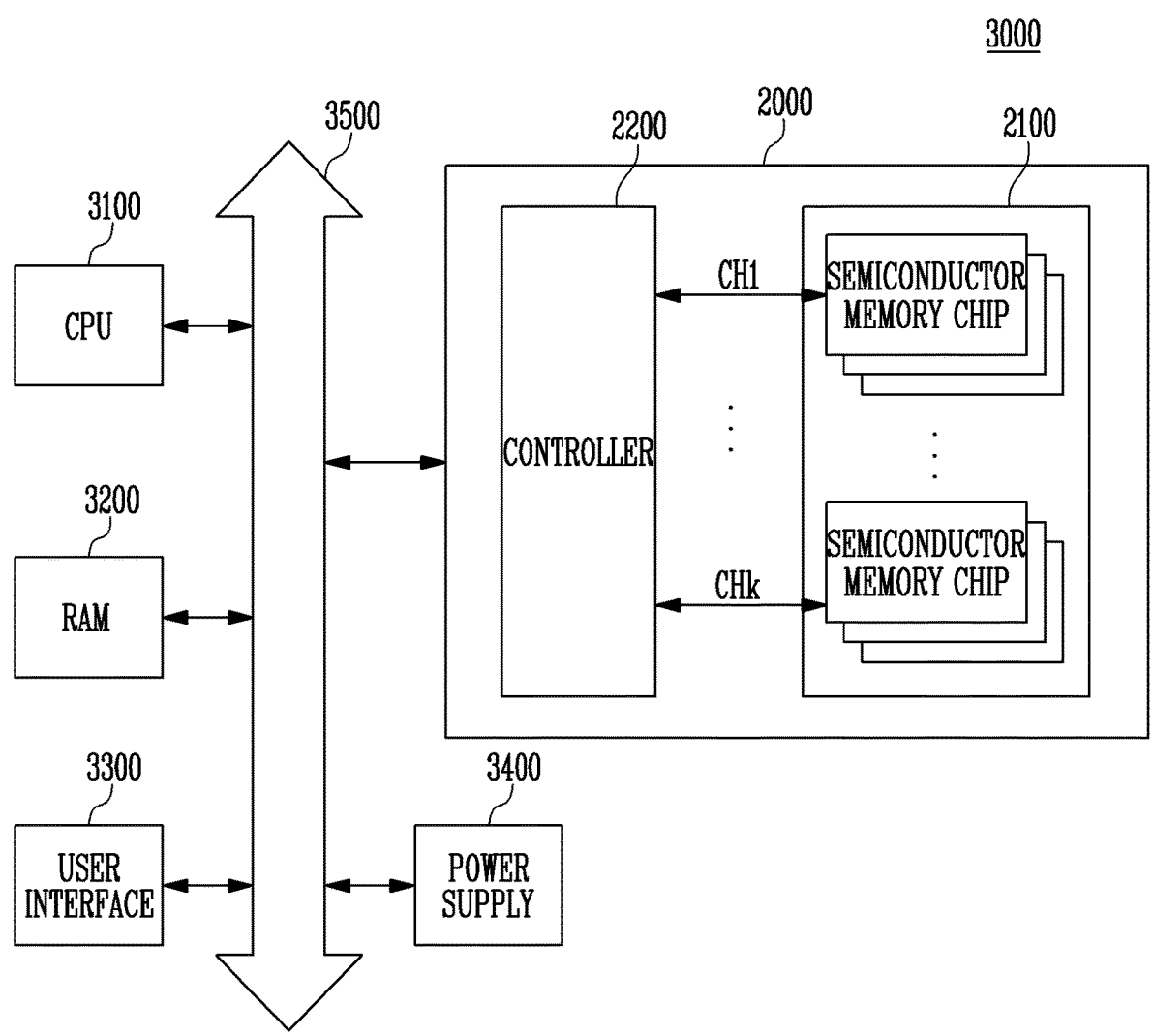
FIG. 16 is a block diagram illustrating a computing system including a storage device, such as that described with reference to FIG. 15.

FIG. 16 is a block diagram illustrating a computing system 3000 including the storage device 2000 described with reference to FIG. 15.

Referring to FIG. 16, the computing system 3000 may include a central processing unit 3100, a RAM 3200, a user interface 3300, a power supply 3400, a system bus 3500, and a storage device 2000.

The storage device 2000 may be electrically coupled to the CPU 3100, the RAM 3200, the user interface 3300, and the power supply 3400 through the system bus 3500. Data provided through the user interface 3300 or processed by the CPU 3100 may be stored in the storage device 2000.

In FIG. 16, the semiconductor memory device 2100 is coupled to the system bus 3500 through the controller 2200. However, the semiconductor memory device 2100 may be directly coupled to the system bus 3500. The function of the controller 2200 may be performed by the CPU 3100 and the RAM 3200.

The storage device 2000 of FIG. 16 may be the storage device described with reference to either of FIG. 14 or 15, or may be of any other suitable configuration. In an embodiment, the computing system 3000 may include both the storage devices 1000 and 2000 described with reference to FIGS. 14 and 15.

As described above, various embodiments of the present disclosure provide a memory device having improved program performance, and a method of operating the memory device.

Various embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a memory device including a plurality of memory cells each having a target programmed state among a plurality of programmed states, the method comprising:

performing at least one program loop corresponding to at least one of the programmed states other than a most significant programmed state among the plurality of programmed states; and applying a program pulse corresponding to the most significant programmed state to a word line, wherein the at least one program loop includes applying a program voltage to a word line coupled in common to the plurality of memory cells, and selectively performing a verify operation of determining whether a threshold voltage of each of the plurality of memory cells exceeds a verify voltage.

2. The method according to claim 1, wherein the program voltage is higher by a step voltage than a program voltage applied to the word line in a previous program loop.

3. The method according to claim 2, wherein a difference between the voltage of the program pulse and a program voltage applied in a last program loop corresponding to a programmed state adjacent to the most significant programmed state is greater than a size of the step voltage.

4. The method according to claim 1, wherein the verify operation corresponding to the most significant programmed state is not performed.

5. The method according to claim 1, wherein the applying of the program voltage comprises applying a program enable voltage to bit lines respectively coupled to memory cells having the most significant programmed state as the target programmed state, and applying a program inhibit voltage to bit lines respectively coupled to memory cells having a programmed state other than the most significant programmed state as the target programmed state.

6. The method according to claim 5, wherein the program enable voltage is a ground voltage, and the program inhibit voltage is a power supply voltage.

7. The method according to claim 1, wherein the applying of the program voltage is performed in response to a signal indicating that the verify operation performed in a last program loop corresponding to a programmed state adjacent to the most significant programmed state has passed.

8. A memory device comprising:
a memory cell array including a plurality of memory cells each having a target programmed state among a plurality of programmed states;
a peripheral circuit configured to perform at least one program loop including applying a program voltage to a word line coupled in common to the plurality of memory cells, and selectively performing a verify operation of determining whether a threshold voltage of each of the plurality of memory cells exceeds a verify voltage; and
a program operation controller configured to control the peripheral circuit to perform the at least one program loop corresponding to at least one of remaining programmed states other than a most significant programmed state among the plurality of programmed states, and apply a program pulse corresponding to the most significant programmed state to the word line.

9. The memory device according to claim 8, wherein the program voltage is higher by a step voltage than a program voltage applied to the word line in a previous program loop.

10. The memory device according to claim 9, wherein the program operation controller controls the peripheral circuit so that a difference between a voltage of the program pulse and the program voltage applied in a last program loop corresponding to a programmed state adjacent to the most significant programmed state is greater than a size of the step voltage.

11. The memory device according to claim 8, wherein the program operation controller controls the peripheral circuit not to perform a verify operation corresponding to the most significant programmed state.

12. The memory device according to claim 8, wherein the program operation controller controls the peripheral circuit to apply the program pulse to the word line by applying a program enable voltage to bit lines respectively coupled to memory cells having the most significant programmed state as the target programmed state, and applying a program inhibit voltage to bit lines respectively coupled to memory cells having remaining programmed states other than the most significant programmed state as the target programmed state.

13. The memory device according to claim 12, wherein the program enable voltage is a ground voltage, and the program inhibit voltage is a power supply voltage.

14. The memory device according to claim 8, wherein the program operation controller controls the peripheral circuit to apply the program pulse to the word line when the verify operation performed in a last program loop corresponding to a programmed state adjacent to the most significant programmed state passes.

15. A method of operating a memory device including a plurality of memory cells each having a target programmed state among a plurality of programmed states, the method comprising:
performing at least one program loop corresponding to at least one of the programmed states other than a most significant programmed state among the plurality of programmed states;
verifying a threshold voltage of each of the plurality of memory cells having the most significant programmed state as the target programmed state;
controlling a voltage to be applied to a bit line coupled to each of memory cells having the most significant programmed state as the target programmed state based on a result of the verifying; and
applying a program pulse corresponding to the most significant programmed state to a word line,
wherein the at least one program loop includes applying a program voltage to a word line coupled in common to the plurality of memory cells, and selectively performing a verify operation of determining whether a threshold voltage of each of the plurality of memory cells exceeds a verify voltage.

16. The method according to claim 15, wherein the program voltage is higher by a step voltage than a program voltage applied to the word line in a previous program loop.

17. The method according to claim 16, wherein a difference between a voltage of the program pulse and the program voltage applied in a last program loop corresponding to a programmed state adjacent to the most significant programmed state is greater than a size of the step voltage.

18. The method according to claim 15,
wherein the controlling comprises applying a program enable voltage to bit lines respectively coupled to memory cells determined to have failed as a result of performing a verify operation corresponding to the most significant programmed state, and
wherein the program enable voltage is a ground voltage.

19. The method according to claim 15,
wherein the controlling comprises applying a program inhibit voltage to bit lines respectively coupled to memory cells determined to have passed as a result of performing a verify operation corresponding to the most significant programmed state, and wherein the program inhibit voltage is a power supply voltage.

20. The method according to claim 15, wherein the applying is performed in response to a signal indicating that the verify operation in a last program loop corresponding to a programmed state adjacent to the most significant programmed state has passed.

* * * * *